United States Patent
Imai et al.

(10) Patent No.: US 6,696,357 B2
(45) Date of Patent: Feb. 24, 2004

(54) METHOD FOR MANUFACTURING SEMICONDUCTOR INTEGRATED CIRCUIT DEVICES USING A CONDUCTIVE LAYER TO PREVENT PEELING BETWEEN A BONDING PAD AND AN UNDERLYING INSULATING FILM

(75) Inventors: Toshinori Imai, Ome (JP); Tsuyoshi Fujiwara, Hamura (JP); Tomohiro Shiraishi, Yokohama (JP); Hiroshi Ashihara, Ome (JP); Masaaki Yoshida, Hamura (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 10/195,716

(22) Filed: Jul. 16, 2002

(65) Prior Publication Data

US 2003/0045088 A1 Mar. 6, 2003

(30) Foreign Application Priority Data

Aug. 30, 2001 (JP) ........................................ 2001-261614

(51) Int. Cl.⁷ .............................................. H01L 21/60
(52) U.S. Cl. ........................ 438/612; 438/633; 438/637; 438/656; 438/688
(58) Field of Search ................................. 438/612, 633, 438/648, 637, 656, 685, 688

(56) References Cited

U.S. PATENT DOCUMENTS

| | | | | |
|---|---|---|---|---|
| 6,069,066 A | * | 5/2000 | Huang et al. | 438/612 |
| 6,218,302 B1 | * | 4/2001 | Braeckelmann et al. | 438/687 |
| 6,376,353 B1 | * | 4/2002 | Zhou et al. | 438/612 |
| 6,410,435 B1 | * | 6/2002 | Ryan | 438/687 |
| 6,423,625 B1 | * | 7/2002 | Jang et al. | 438/614 |
| 2001/0022403 A1 | * | 9/2001 | Lee et al. | 257/781 |

FOREIGN PATENT DOCUMENTS

| | | |
|---|---|---|
| JP | 5-160133 | 6/1993 |
| JP | 2001-185552 | 7/2001 |

* cited by examiner

*Primary Examiner*—Carl Whitehead, Jr.
*Assistant Examiner*—Stephen W. Smoot
(74) *Attorney, Agent, or Firm*—Miles & Stockbridge P.C.

(57) ABSTRACT

Peeling between a bonding pad and an insulating film which underlies the bonding pad is to be prevented. A laminate film constituted mainly by W which is higher in mechanical strength than a wiring layer using an Al alloy film as a main conductive layer and than a bonding pad, is formed within an aperture formed in silicon oxide films and is interposed between the wiring line and the bonding pad.

16 Claims, 20 Drawing Sheets

FIG. 3
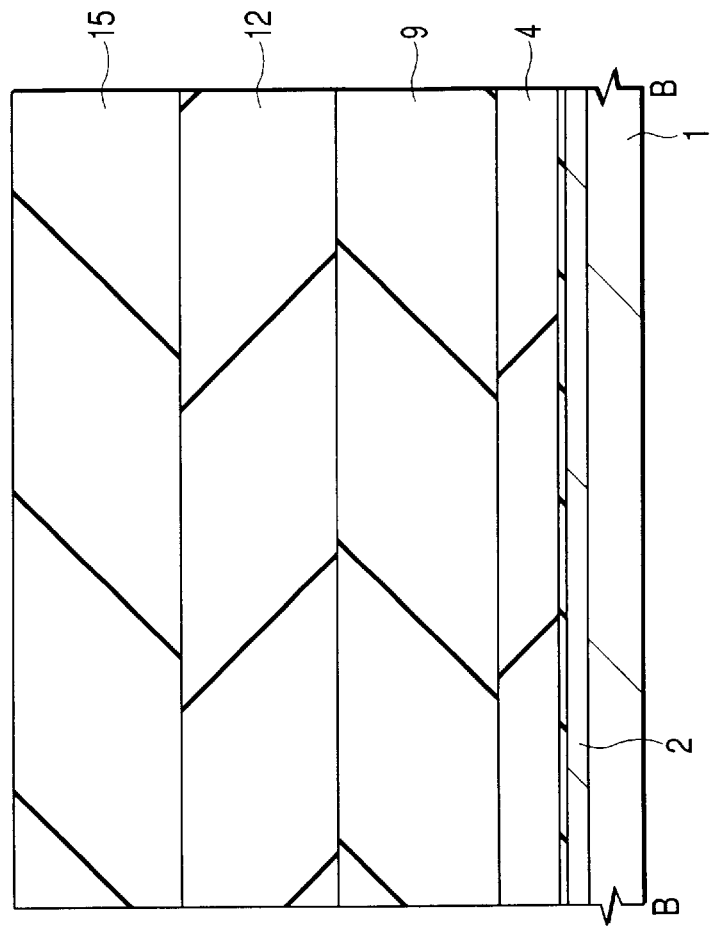
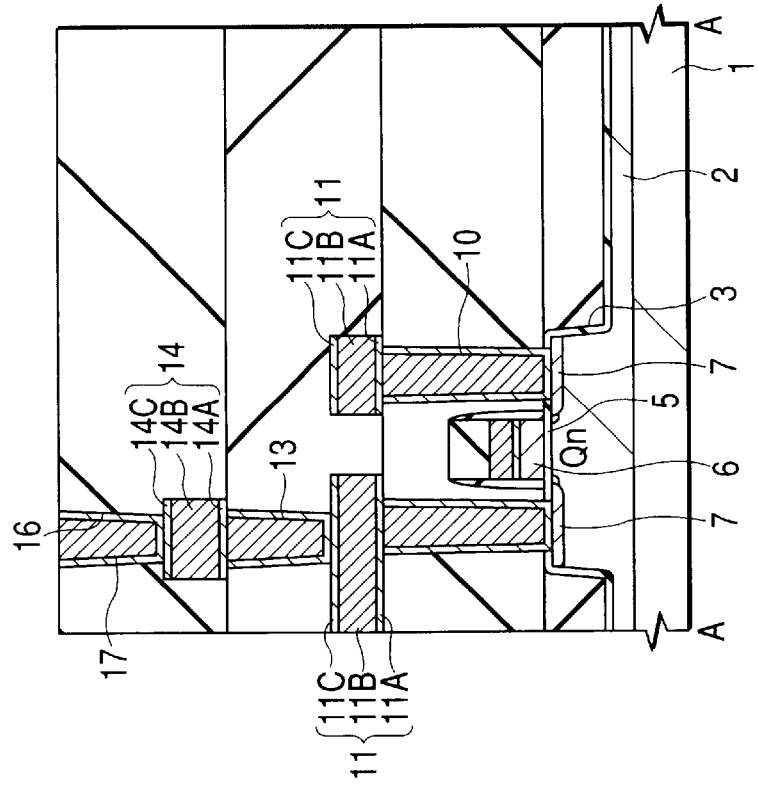

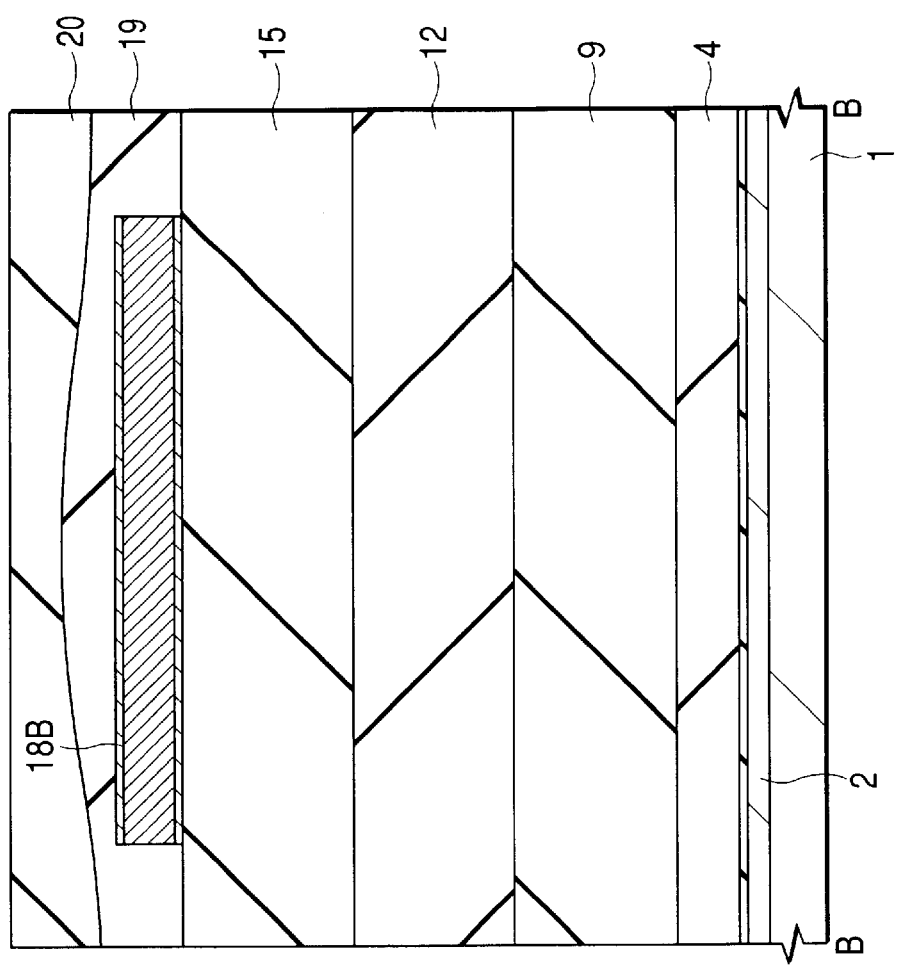
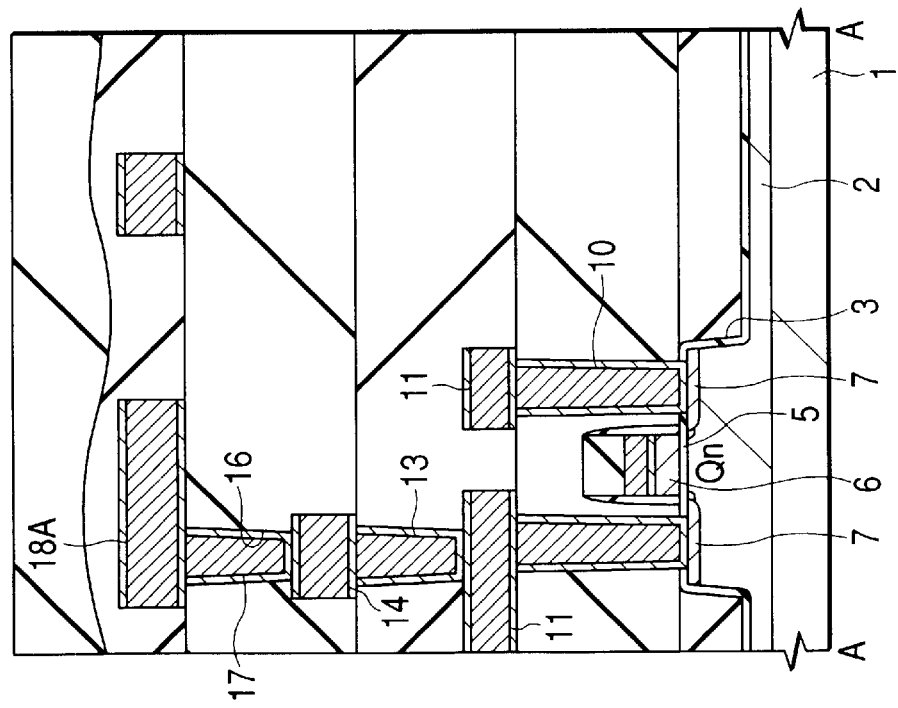
FIG. 6

FIG. 17
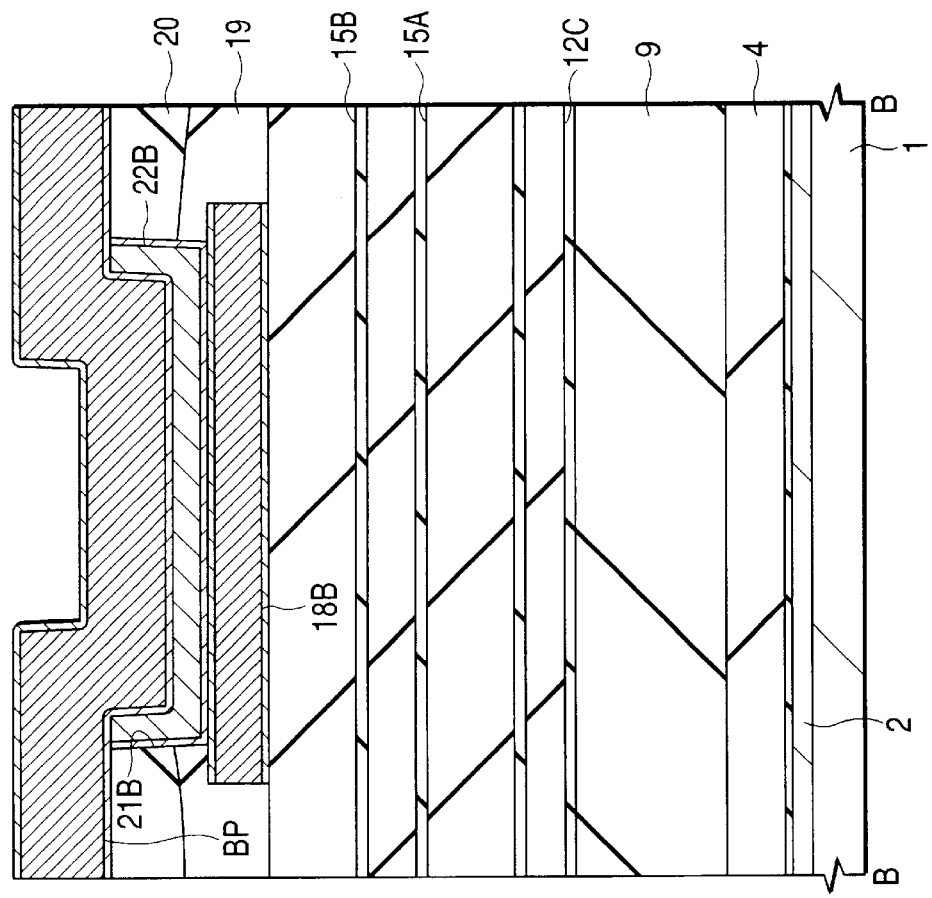
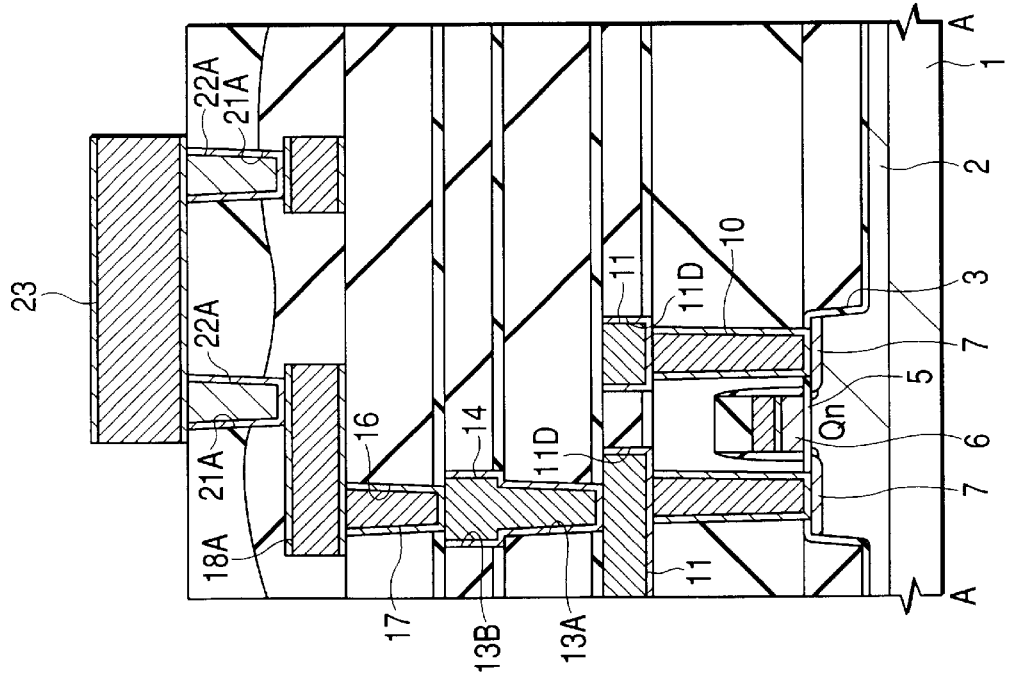

METHOD FOR MANUFACTURING SEMICONDUCTOR INTEGRATED CIRCUIT DEVICES USING A CONDUCTIVE LAYER TO PREVENT PEELING BETWEEN A BONDING PAD AND AN UNDERLYING INSULATING FILM

BACKGROUND OF THE INVENTION

The present invention relates to a semiconductor integrated circuit device and a method of manufacturing the same. Particularly, the present invention is concerned with a technique which is effectively applicable to the improvement of adhesion between a bonding pad and an interlayer insulating film which underlies the bonding pad.

In Japanese Published Unexamined Patent Application No. Hei 5(1993)-160133 there is disclosed a technique in which a through hole extending up a bonding pad is formed in a surface protecting film formed on the whole surface of a semiconductor substrate, then W (tungsten) film is formed in the interior of the through hole, and thereafter an Al (aluminum) electrode is formed on the W film and surface protecting film, thereby making the area of opening of the through hole smaller than the diameter of a bonding wire.

In Japanese Published Unexamined Patent Application No. 2001-185552 there is disclosed a technique in which plural plugs integral with a bonding pad are formed on an interlayer insulating film just underlying the bonding pad, thereby improving the adhesion between the bonding pad and the interlayer insulating film to prevent the peeling of the bonding pad.

SUMMARY OF THE INVENTION

Recently, with high integration of LSI and consequent decrease of chip size, there has been a tendency toward a decrease in the size of bonding pads.

The present inventors have found out that a peeling phenomenon at the interface between a top Al (aluminum) wiring layer constituting a bonding pad and an underlying interlayer insulating film is being actualized due to an increase of stress applied to the bonding pad under vibration and loading in wire bonding. Particularly, in a MCP (Multi-Chip Package) manufacturing process, there is used a KGD (Known Good Die) technique for guaranteeing the quality of individual chips before assembly. In this case, wires are bonded onto bonding pads at the time of the individual chip inspection and also at the time of the package inspection stage, so that the peeling of bonding pads is more likely to occur.

Forming the bonding pads by a two-layer structure of a top Al wiring layer and an underlying Al wiring layer to enhance the strength thereof may be an effective means for preventing the peeling of the bonding pads. In this case, however, an interlayer insulating film formed of silicon higher in hardness than Al is interposed between the two Al wiring layers, so that the interlayer insulating film may be cracked by impact in wire bonding and this crack may cause peeling of the bonding pads.

It is an object of the present invention to provide a technique which can prevent the peeling of a bonding pad.

The above and other objects and novel features of the present invention will become apparent from the following description and the accompanying drawings.

Typical inventions disclosed herein will be outlined below.

In a first aspect of the present invention there is provided a semiconductor integrated circuit device comprising:
(a) a first conductor piece disposed on a first insulating film formed on a semiconductor substrate;
(b) a second insulating film disposed on the first insulating film and the first conductor piece and having a first aperture on the first conductor piece;
(c) a second conductor piece formed in the interior of the first aperture and having a film thickness smaller than the depth of the first aperture at a central plane portion of the first aperture, the second conductor piece being electrically connected to the first conductor piece; and
(d) a third conductor piece disposed on the second conductor piece and being in contact with the second conductor piece.

In a second aspect of the present invention there is provided, in combination with the first aspect, a semiconductor integrated circuit device wherein the second conductor piece includes a tungsten layer.

In a third aspect of the present invention there is provided, in combination with the second aspect, a semiconductor integrated circuit device wherein the third conductor piece includes an aluminum layer.

In a fourth aspect of the present invention there is provided, in combination with the third aspect, a semiconductor integrated circuit device including a third insulating film, the third insulating film being disposed on the second insulating film and the third conductor piece and having a second opening in an area to which a wire is connected.

In a fifth aspect of the present invention there is provided a semiconductor integrated circuit device comprising a semiconductor substrate having on a main surface thereof a first area and a second area different from the first area; a first insulating film formed on the main surface of the semiconductor substrate; a first conductor piece disposed on the first insulating film in the first area; a fourth conductor piece disposed on the first insulating film in the second area; a second insulating film disposed on the first insulating film and the first and fourth conductor pieces and having a first aperture on the first conductor piece and also having a third aperture on the fourth conductor piece; a second conductor piece formed in the interior of the first aperture and having a film thickness smaller than the depth of the first aperture at a central plane portion of the first aperture, the second conductor piece being electrically connected to the first conductor piece; a fifth conductor piece formed in the interior of the third aperture and having a film thickness almost equal to the depth of the first aperture at a central plane portion of the first aperture, the fifth conductor piece being electrically connected to the fourth conductor piece; a third conductor piece disposed on the second conductor piece in the first area and being in contact with the second conductor piece; a sixth conductor piece disposed on the fifth conductor piece in the second area and being in contact with the fifth conductor piece; a third insulating film disposed on the second insulating film and the third and sixth conductor pieces and having a second aperture to which a part of the third conductor piece is exposed; and a wire connected to the third conductor piece within the second aperture.

In a sixth aspect of the present invention there is provided, in combination with the fifth aspect, a semiconductor integrated circuit device wherein the second and fifth conductor pieces include a tungsten layer.

In a seventh aspect of the present invention there is provided, in combination with the sixth aspect, a semiconductor integrated circuit device wherein the third and sixth conductor pieces include an aluminum layer.

In an eighth aspect of the present invention there is provided, in combination with the fifth aspect, a semiconductor integrated circuit device wherein the third insulating film includes a silicon nitride film.

In a ninth aspect of the present invention there is provided, in combination with the fifth aspect, a semiconductor integrated circuit device wherein the second and fifth conductor pieces include a laminate structure of a titanium layer, a titanium nitride layer and a tungsten layer.

In a tenth aspect of the present invention there is provided, in combination with the fifth aspect, a semiconductor integrated circuit device wherein the diameter in a plane pattern of the third aperture is smaller than the diameter in a plane pattern of the first aperture.

In an eleventh aspect of the present invention there is provided, in combination with the fifth aspect, a semiconductor integrated circuit device wherein the first insulating film includes an insulating film having a dielectric constant of 4 or less.

In a further aspect of the present invention there is provided a method of manufacturing a semiconductor integrated circuit device, comprising the steps of forming a first insulating film on a semiconductor substrate; forming a first conductor piece on the first insulating film; forming a second insulating film on the first insulating film and the first conductor piece and thereafter forming a first aperture in the second insulating film, the first aperture extending onto the first conductor piece; forming a first conductive film on the second insulating film including the interior of the first aperture, the first conductive film having a thickness smaller than the depth of the first aperture at a central plane portion of the first aperture; polishing the first conductive film on the second insulating film chemically and mechanically to form a second conductor piece within the first aperture, the second conductor piece being constituted by the first conductive film; and forming a third conductor piece on the second conductor piece, the third conductor piece being in contact with the second conductor piece.

BRIEF DESCRIPTION OF THE DRAWINGS

FIG. 3 is a sectional view of a principal portion, showing a method of manufacturing the semiconductor integrated circuit device embodying the present invention;

FIG. 6 is a sectional view of the principal portion in a semiconductor integrated circuit device manufacturing step which follows FIG. 5;

FIG. 17 is a sectional view of the principal portion in a semiconductor integrated circuit device manufacturing step which follows FIG. 16;

DETAILED DESCRIPTION OF PREFERRED EMBODIMENTS

Figure 1:
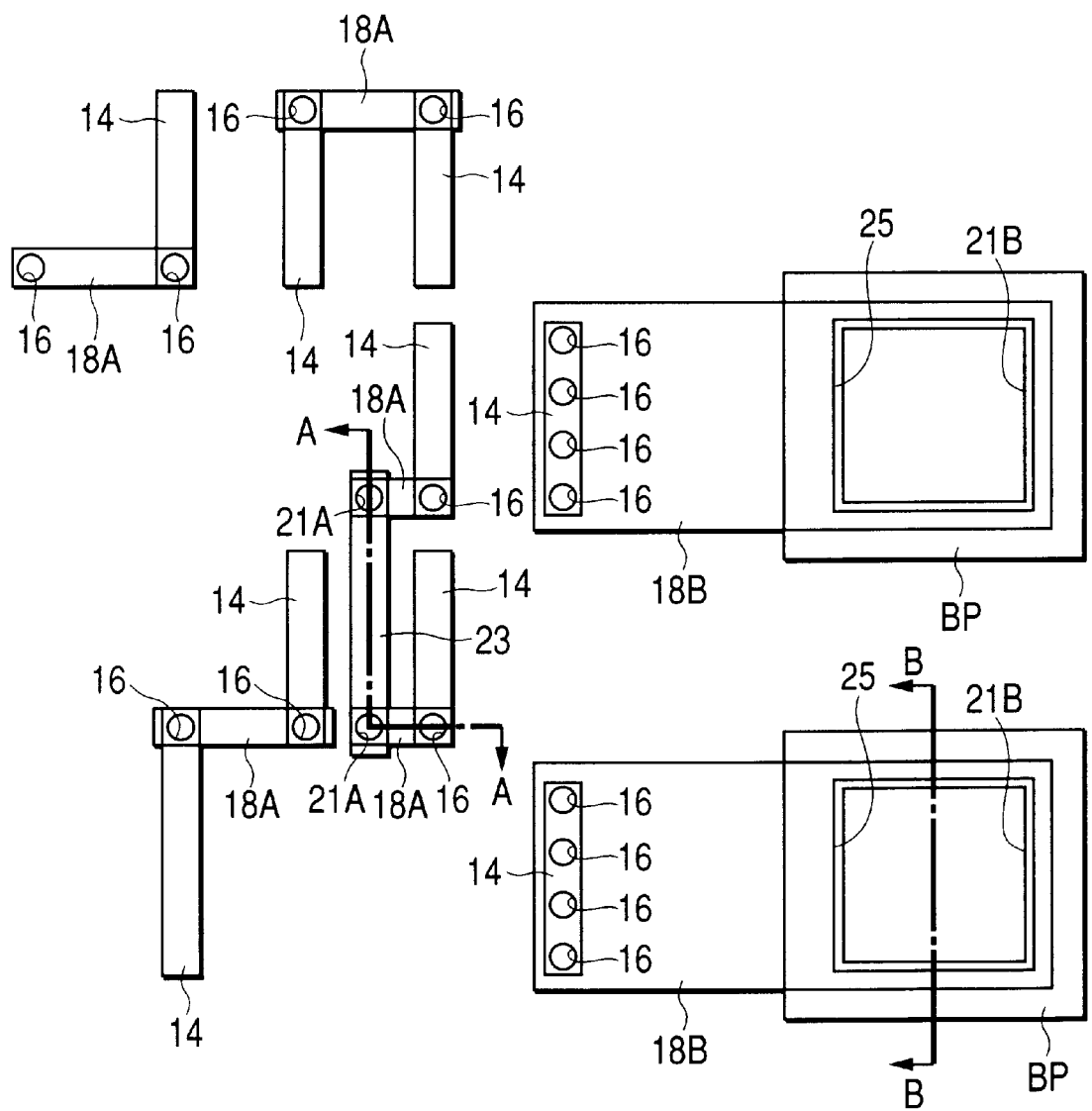
FIG. 1 is a plan view of a principal portion of a semiconductor integrated circuit device embodying the present invention.

Embodiments of the present invention are described in detail below with reference to the accompanying drawings. In all of the drawings for illustrating the embodiments, members having the same functions are identified by the same reference numerals and repeated explanations thereof will be omitted.

(First Embodiment)

Figure 2:
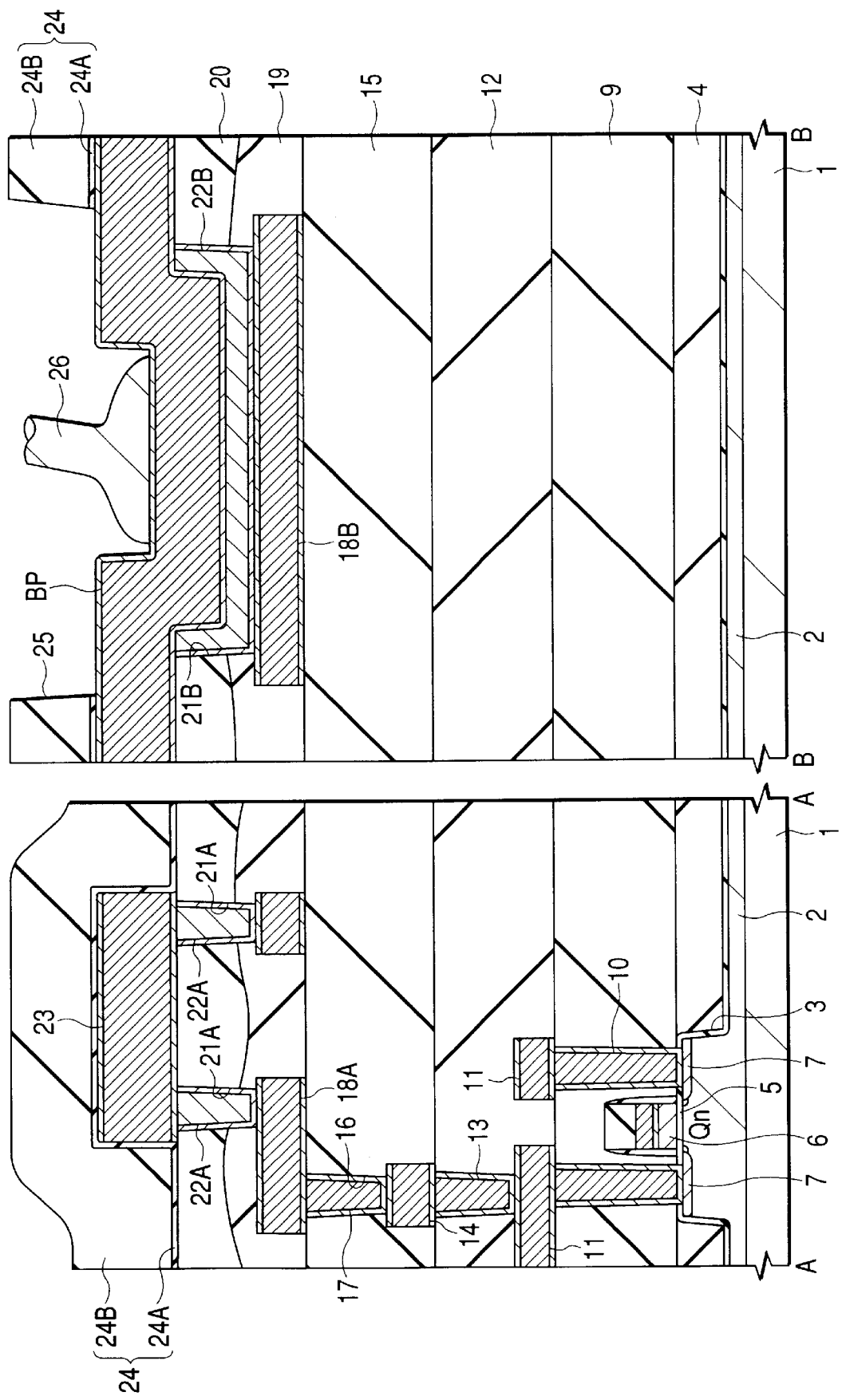
FIG. 2 is a sectional view of a principal portion of the semiconductor device embodying the present invention.

FIG. 1 is a plan view showing a principal portion of a semiconductor chip with a semiconductor integrated circuit device of the first embodiment formed thereon and FIG. 2 is a sectional view taken on lines A—A and B—B in FIG. 1. The section taken on line A—A shows an area (second area) where laminate wiring is formed, while the section taken on line B—B shows an area (first area) where bonding pads are formed.

A p-type well is formed on a main surface of a substrate 1 which is constituted by, for example, a single crystal Si (silicon), and an element isolation trench 3 is formed in an element isolation region of the p-type well. The element isolation trench 3 is of a construction wherein an insulating film 4 such as a silicon oxide film is buried in a trench formed by etching the substrate 1.

An n-channel type MISFETQn consists principally of a gate oxide film 5, a gate electrode 6, and n-type semiconductor regions (source and drain) 7 of an LDD (Lightly Doped Drain) structure. The gate electrode 6 is formed by a three-layer conductive film constituted by a laminate of, for example, a phosphorus (P)-doped polycrystal silicon film of low resistance, a WN (tungsten nitride) film, and a W (tungsten) film.

A silicon oxide film 9 is formed on an n-channel type MISFET. In the silicon oxide film 9 are formed contact holes extending to the n-type semiconductor regions (source and drain) 7 of n-channel type MISFETQn. A plug 10 is buried in the interior of each contact hole, which plug is formed, for example, by a laminate film of barrier metal (TiN/Ti) and W film.

Wiring lines 11 as first-layer wiring lines are formed on the silicon oxide film 9. For example, the wiring lines 11 are each formed by a three-layer conductive film comprising a thick Al alloy film containing Cu (copper) and Si, as well as thin Ti film and TiN film formed so as to sandwich the Al alloy film. Each wiring line 11 is electrically connected to one of the n-type semiconductor regions (source and drain) 7 of n-channel MISFETQn through the associated plug 10.

A silicon oxide film 12 is formed on the wiring lines 11. Contact holes extending to the wiring lines 11 are formed in the silicon oxide film 12 and a plug 13 is buried in the interior of each such contact hole, the plug 13 being constituted by a laminate film of barrier metal (TiN/Ti) and W film like the plug 10.

On the silicon oxide film 12 is formed second-layer wiring lines 14, which are electrically connected to the wiring lines 11 through the plugs 13. In FIG. 1, as to the construction of the layers which underlie the wiring lines 14, illustration thereof is omitted in order that the construction of the layer of wiring lines 14 and upper layers in the semiconductor integrated circuit device of this first embodiment may be easier to understand.

On the wiring lines 14 is formed a silicon oxide film (first insulating film) 15. Contact holes 16 extending to the wiring lines 14 are formed in the silicon oxide film 15 and plugs 17 are buried within the contact holes 16, the plugs being each constituted by a laminate film of barrier metal (TiN/Ti) and W film like the plugs 10 and 13.

On the silicon oxide film 15 are formed third-layer wiring lines 18A (fourth conductor piece) and 18B (first conductor piece) which are of the same construction as the wiring lines 11 and 14. The wiring lines 18A, which are disposed in the region where laminate wiring is formed, are electrically connected to the wiring lines 14 through plugs 17. The wiring line 18B is disposed in the region where a bonding pad is formed.

Silicon oxide films (second insulating films) 19 and 20 formed in plasma are laminated onto the wiring line 18. In the region where laminate wiring is formed, contact holes (third apertures) 21A extending to the wiring lines 18A are formed in the silicon oxide films 19 and 20. Plugs 22A are buried within the contact holes 21A, the plugs 22A being each constituted by a laminate film of a thin barrier metal (TiN/Ti) and a thick W film, like the plugs 10, 13, and 17. On the other hand, in the region where the bonding pad is formed, an aperture (first aperture) 21B extending up to the wiring line 18B is formed in the silicon oxide films 19 and 20, and a laminate film (second conductor piece) 22B comprising barrier metal (TiN/Ti) and W film is formed in the interior of the aperture 21B.

The aperture 21B has a generally square plane shape and the diameter thereof is relatively larger than the opening diameter of each contact hole 21A. An external size of the aperture 21B is 80 $\mu$m long by 80 $\mu$m wide for example. On the other hand, each contact hole 21A has a generally circular opening shape in plan and its opening diameter is about 0.1 to 0.3 $\mu$m for example. An external size of the aperture 21B may be larger than 80 $\mu$m long by 80 $\mu$m wide.

The thickness of the laminate film 22B is smaller than the depth of the aperture 21B and is about 560 nm for example.

In the region where laminate wiring is formed, a fourth-layer wiring line (sixth conductor piece) 23 is formed on the silicon oxide film 20. A bonding pad (third conductor piece) BP is formed on the laminate film 22B.

The wiring line 23 is formed by a three-layer conductive film which is constituted by a thick Al alloy film, as well as thick Ti film and TiN film formed so as to sandwich the Al alloy film. The wiring line 23 is electrically connected to wiring lines 18A through the plugs 22A. The bonding pad BP is formed using a wiring line formed in the same process as the wiring line 23 which is constituted by the three-layer conductive film.

The Al alloy film as a main conductive film of the wiring line 18B and bonding pad BP is softer than Ti film and TiN film, so in the case where the laminate film 22B is not formed between the wiring line 18B and the bonding pad BP, the Ti and TiN films present between the Al alloy film included in the wiring line 18B and the Al alloy film included in the bonding pad BP may be cracked, with consequent separation of both films from each other. In such a case there is a fear that the bonding pad BP may peel off from the wiring line 18B. On the other hand, in the semiconductor integrated circuit device of this first embodiment, as illustrated in the figures, the laminate film 22B constituted mainly by W film, which is higher in physical strength and larger in thickness than the Ti and TiN films included in the wiring line 18B and bonding pad BP, is formed within the aperture 21B in a lower region than the bonding pad BP. Thus, the laminate film 22B is interposed between the wiring line 18B and the bonding pad BP. Consequently, the Ti and TiN films can be prevented from being cracked in wire bonding. That is, it is possible to prevent peeling of the bonding pad BP from the laminate film 22B.

Over the fourth-layer wiring line 23 and the bonding pad BP is formed a surface protecting film (third insulating film) 24 constituted by a two-layer insulating film which is, for example, a laminate of a silicon oxide film 24A and a silicon nitride film 24B. Above the bonding pad BP, an aperture (second aperture) 25 extending up to the bonding pad BP is formed in the surface protecting film 24. The aperture 25 has a generally square plane shape and an external size thereof is larger than the aperture 21B, that is, 100 $\mu$m long by 100 $\mu$m wide for example.

Within the aperture 25, a wire 26, say, Au (gold) wire, is bonded to the bonding pad BP.

Next, with reference to FIGS. 3 to 12, the following description is provided about a method of manufacturing the semiconductor integrated circuit device constructed as above.

First, as shown in FIG. 3, a substrate 1 formed by a single crystal silicon with a resistivity of about 10 $\Omega$cm is heat-treated to form a thin silicon oxide film (pad oxide film) on a main surface of the substrate 1. Then, a silicon nitride film is deposited on the silicon oxide film by a CVD (Chemical Vapor Deposition) method, followed by dry etching with a photoresist film as mask to remove both silicon nitride film and silicon oxide film from an element isolation region. The silicon oxide film is formed for the purpose of relieving stress which is imposed on the substrate for example when densifying the silicon oxide film buried in an element isolation trench in a later step. The silicon nitride film possesses a property difficult to be oxidized, so is utilized as a mask for preventing the oxidation of a substrate surface in an underlying portion (active region).

Subsequently, by dry etching with the silicon nitride film as mask, a trench of 350 nm or so in depth for example, is formed in the substrate 1 in the element isolation region and thereafter, for removing a damage layer which has occurred on an inner wall of the trench by etching, the substrate 1 is heat-treated to form a thin silicon oxide film on the inner wall of the trench.

Then, a silicon oxide film 4 is deposited on the substrate 1 and, for improving the quality of the silicon oxide film 4, the substrate 1 is heat-treated to densify the silicon oxide film 4. Thereafter, the silicon oxide film 4 is polished by a chemical mechanical polishing (CMP) method using the silicon nitride film as a stopper, allowing the silicon oxide film to remain in the interior of the trench, thereby forming an element isolation trench 3 having a flattened surface.

Next, the silicon nitride film remaining on the active region of the substrate 1 is removed by wet etching with use of hot phosphoric acid and thereafter B (boron) ions are implanted into the substrate 1 to form a p-type well 2.

Subsequently, a gate oxide film 5 is formed on a surface of the p-type well 2 by heat-treating the substrate 1, followed by forming a gate electrode 6 on the gate oxide film 5. For example, the gate electrode 6 is formed by laminating a P-doped polycrystalline silicon film of low resistance, WN (tungsten nitride) film, and W (tungsten) film in this order and by subsequently patterning these thin films by dry etching through a photoresist film as mask.

Next, an n$^-$-type semiconductor region is formed on the p-type well 2 by ion implantation of P or As (arsenic). Subsequently, for example a silicon oxide film is deposited on the substrate 1 and is then subjected to anisotropic etching to form a sidewall spacer on the side wall of the gate electrode 6. Then, P or As (arsenic) is ion-implanted to an n-channel type MISFETQn forming region of the substrate 1 to form an n$^+$-type semiconductor region self-alignmentwise for the sidewall spacer, whereby n-type semiconductor regions (source and drain) 7 of LDD structure can be formed. By the steps so far described it is possible to form an n-channel MISFETQn.

Then, a silicon oxide film 9 as an interlayer insulating film is formed on the substrate 1 and is thereafter dry-etched using as mask a photoresist film which has been subjected to patterning by photolithography to form a contact hole on each of the n-type semiconductor regions (source and drain) 7. Next, a barrier metal film (TiN film/Ti film) is formed on the substrate 1 including the interior of the contact hole, followed by further deposition of W film, allowing the contact hole to be buried in the W film. Thereafter, the barrier metal film and W film on the silicon oxide film 9, exclusive of the contact hole, are removed by the CMP method for example to form a plug 10.

Next, a wiring line 11 is formed in the region where laminate wiring is formed. The wiring line 11 is formed by depositing Ti film 11A, Al alloy film 11B and TiN film 11C in this order onto the silicon oxide film 9 and by subsequently etching these thin films.

Then, a silicon oxide film 12 is formed on the substrate 1 and is thereafter etched to form a contact hole. Next, a barrier metal film (TiN film/Ti film) and W film are deposited in this order over the silicon oxide film 12 including the interior of the contact hole, followed by removal of the barrier metal film and W film on the silicon oxide film 12 in accordance with the CMP method to form a plug 13.

Next, by the same step as the above step of forming the wiring line 11, a wiring line 14 is formed in the laminate wiring forming region, the wiring line 14 being constituted by three layers of thin films which are Ti film 14A, Al alloy film 14B, and TiN film 14C.

Subsequently, a silicon oxide film 15 is formed on the substrate 1 and is then etched to form a contact hole 16.

Next, a plug 17 is formed within the contact hole 16 by the same step as the step of forming the plug 13.

Figure 4:
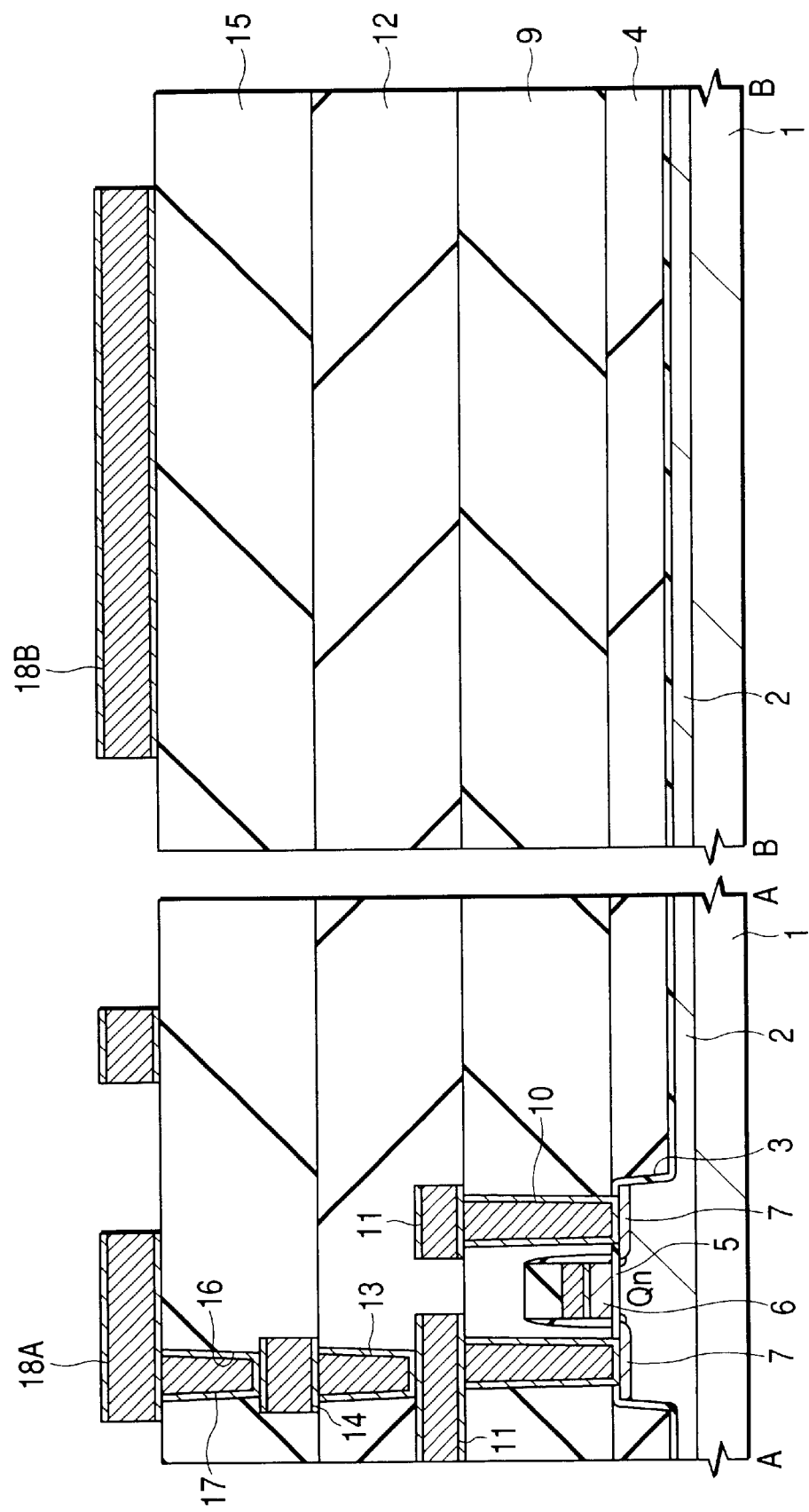
FIG. 4 is a sectional view of the principal portion in a semiconductor integrated circuit device manufacturing step which follows FIG. 3.

Next, as shown in FIG. 4, by the same step as the step of forming the wiring lines 11 and 14, wiring lines 18A and 18B each constituted by three layers of thin films which are Ti film, Al alloy film, and TiN film, are formed respectively in the laminate wiring forming region and the bonding pad forming region, followed by deposition of a silicon oxide film 19 onto the substrate 1 in accordance with a plasma CVD method using high-density plasma. Then, a silicon oxide film 20 is deposited on the silicon oxide film 19 by the plasma CVD method using high-density plasma. Next, as shown in FIG. 6, the surface of the silicon oxide film 20 is polished by the CMP method for example to level the surface.

Figure 7:
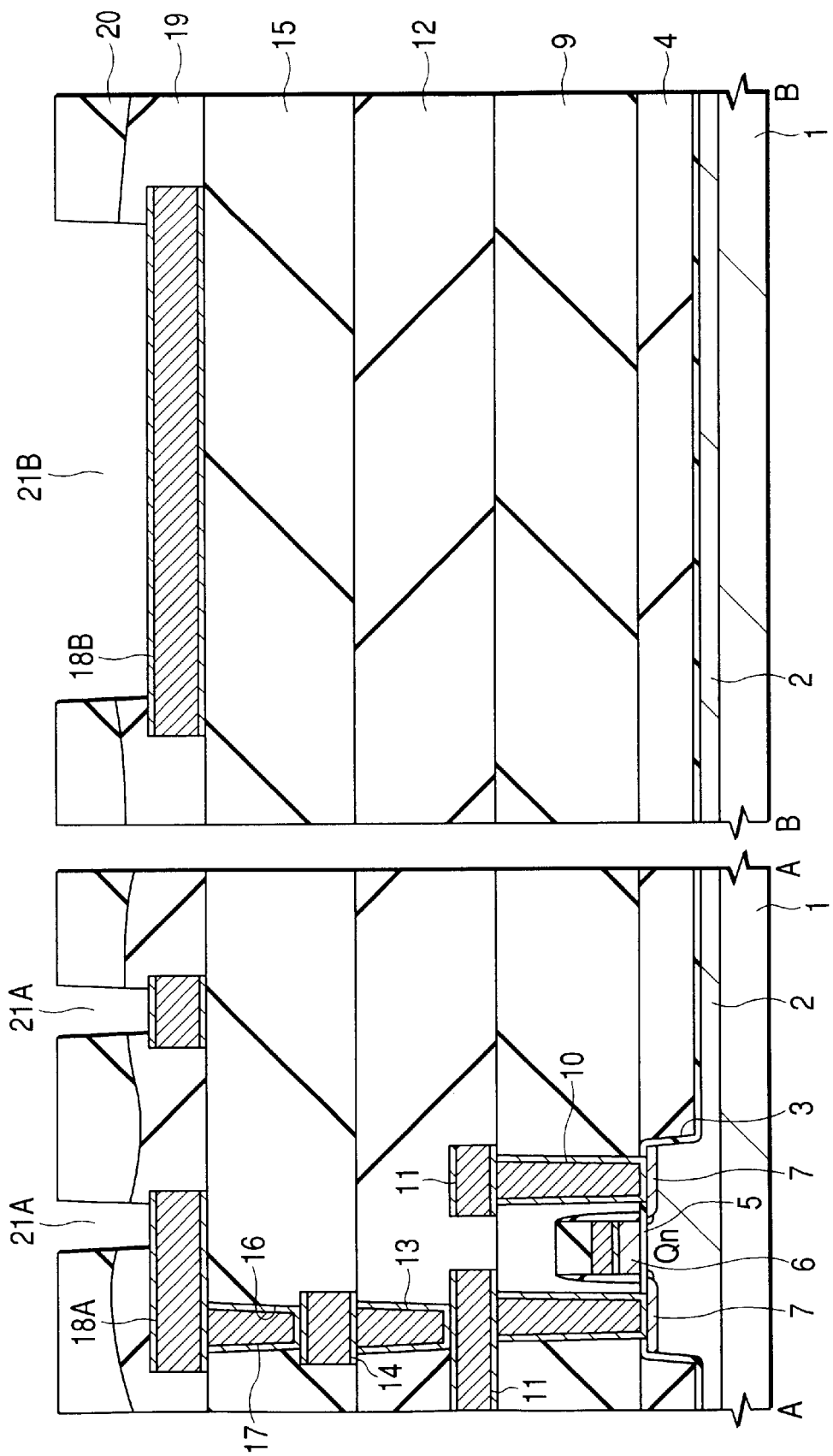
FIG. 7 is a sectional view of the principal portion in a semiconductor integrated circuit device manufacturing step which follows FIG. 6.

Thereafter, as shown in FIG. 7, the silicon oxide films 20 and 19 are etched using as mask a photoresist film (not shown) which has been subjected to patterning by photolithography, to form a contact hole 21A extending to the wiring line 18A in the laminate wiring forming region and also form an aperture 21B extending to the wiring line 18B in the bonding pad forming region. At this time, the diameter of the aperture 21B is set relatively larger than the opening diameter of the contact hole 21A.

Figure 8:
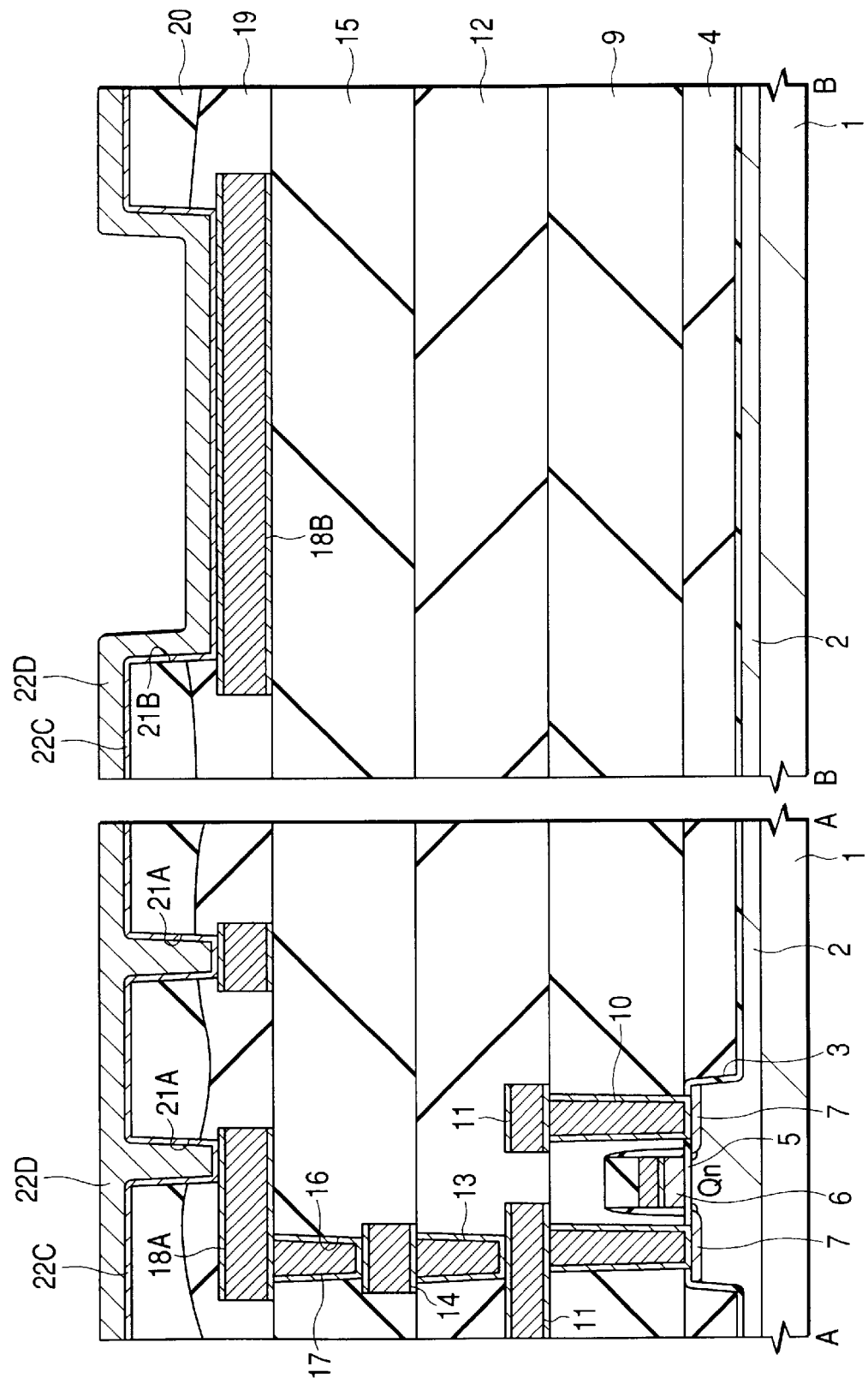
FIG. 8 is a sectional view of the principal portion in a semiconductor integrated circuit device manufacturing step which follows FIG. 7.

Next, as shown in FIG. 8, a barrier metal film 22C comprising Ti film about 10 nm in thickness and TiN film about 50 nm in thickness is deposited over the silicon oxide film 20 including the interior of the contact hole 21A and the interior of the aperture 21B. Subsequently, W film 22D about 500 nm in thickness is deposited over the barrier metal film 22C. At this time, within the aperture 21B, the thickness of a laminated film (first conductive film) comprising the barrier metal film 22C and W film 22D is set so as to be smaller than the depth of the aperture 21B.

Figure 9:
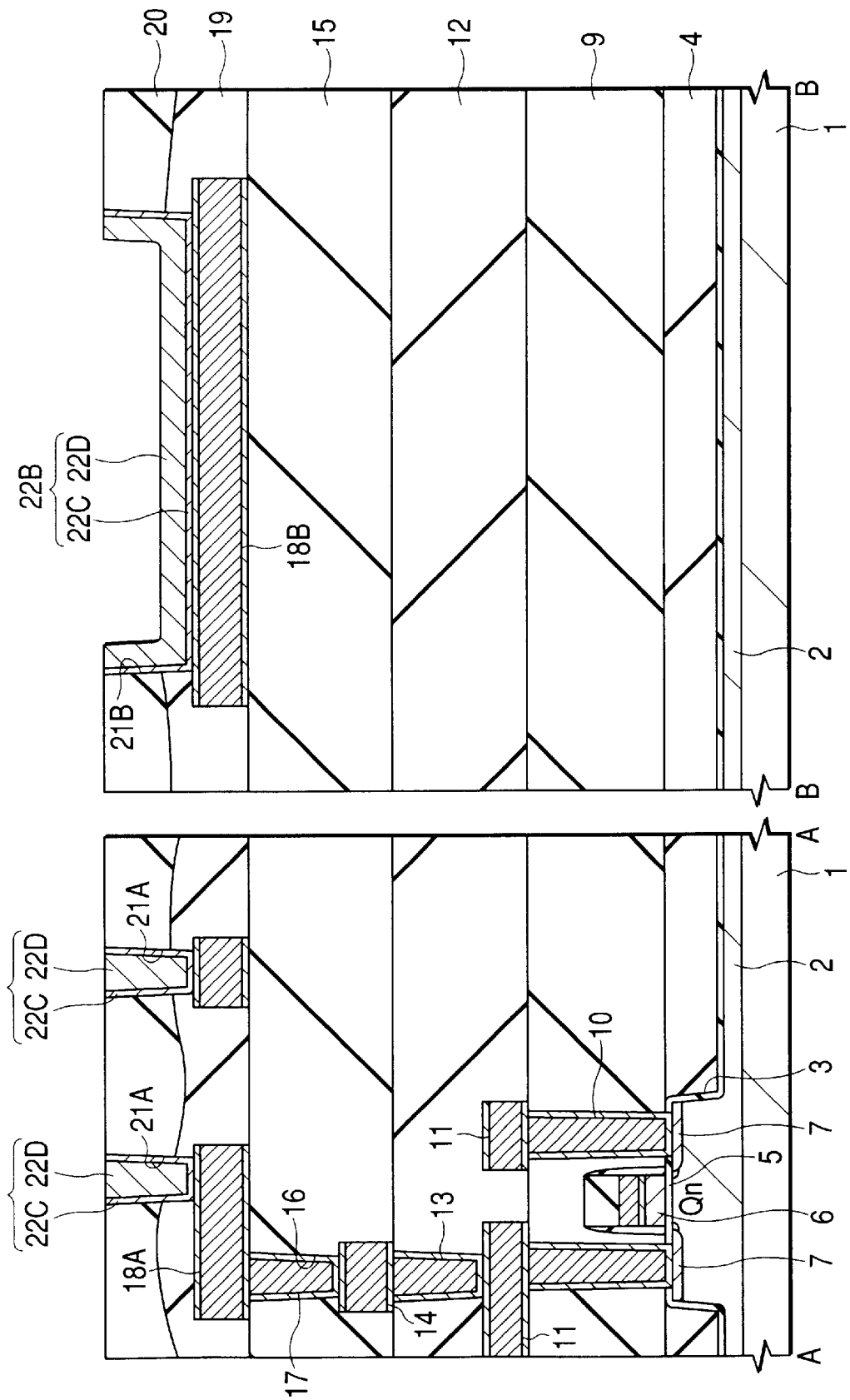
FIG. 9 is a sectional view of the principal portion in a semiconductor integrated circuit device manufacturing step which follows FIG. 8.

Next, as shown in FIG. 9, the W film 22D and barrier metal film 22C present on the exterior of the contact hole 22A and that of the aperture 22B are removed by the CMP method to form a plug 22A in the interior of the contact hole 21A and form a laminate film 22B in the interior of the aperture 21B.

Figure 10:
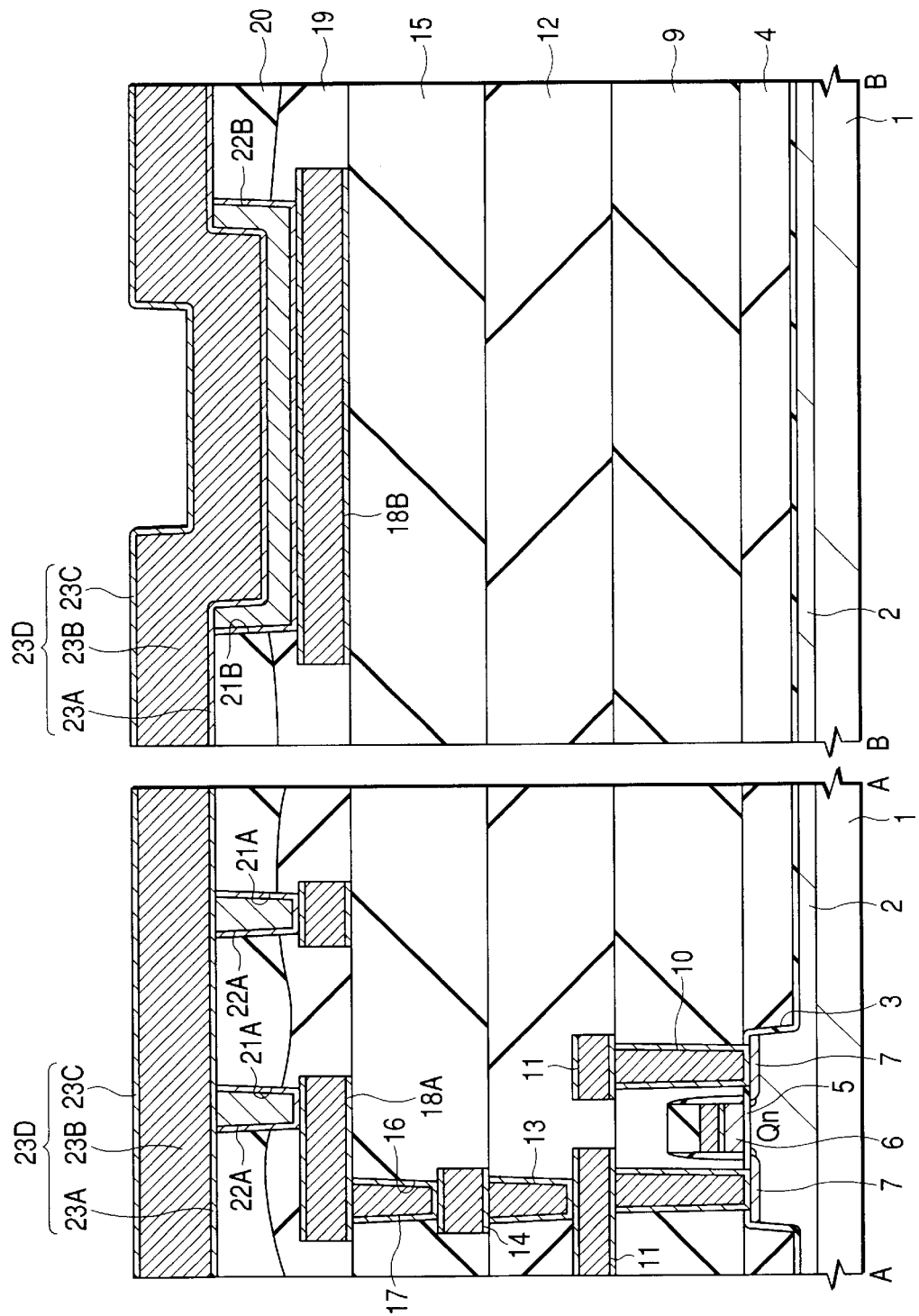
FIG. 10 is a sectional view of the principal portion in a semiconductor integrated circuit device manufacturing step which follows FIG. 9.
Figure 11:
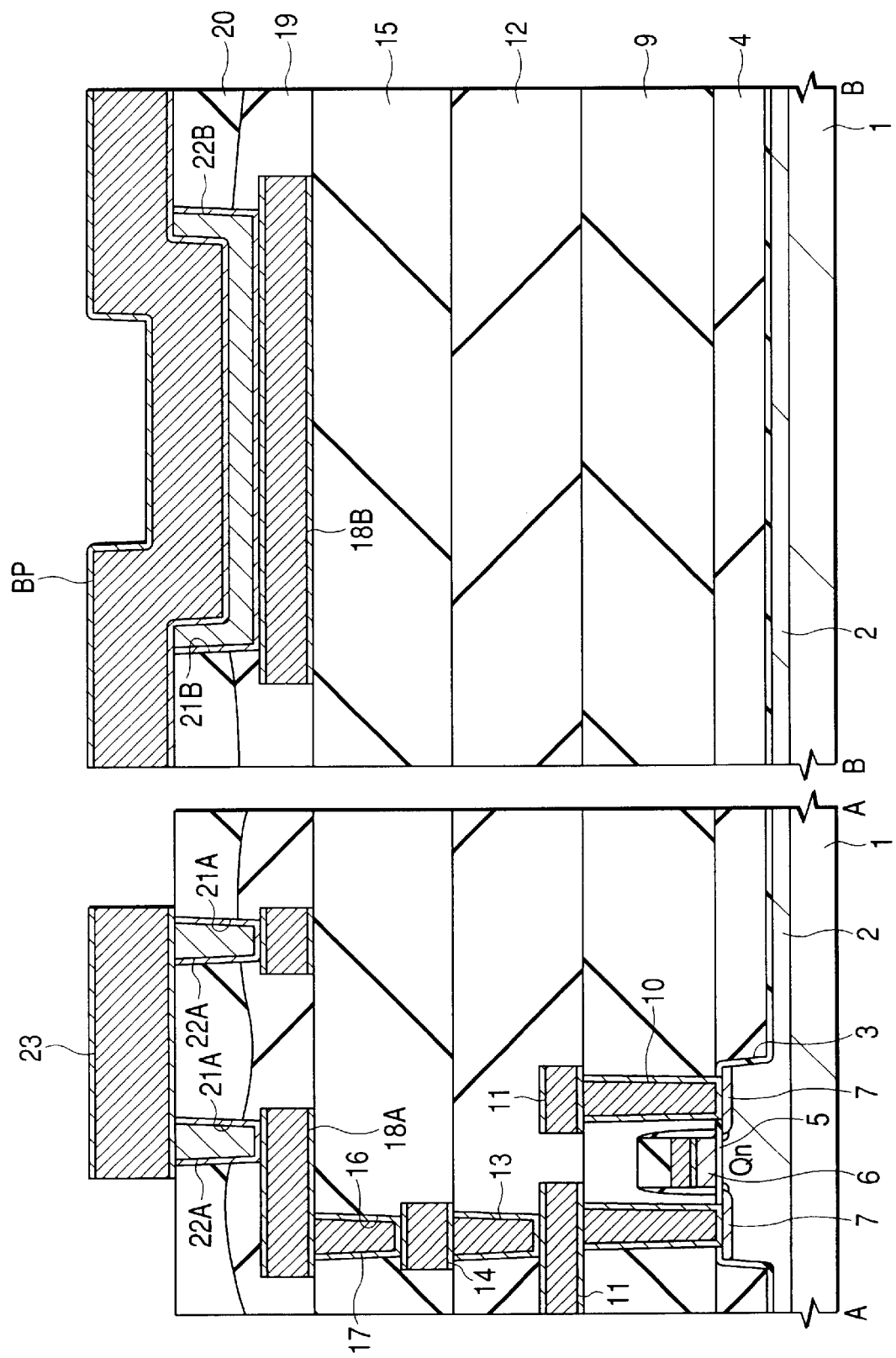
FIG. 11 is a sectional view of the principal portion in a semiconductor integrated circuit device manufacturing step which follows FIG. 10.

Then, as shown in FIG. 10, Ti film 23A, Al alloy film 23B, and TiN film 23C are deposited in this order onto the silicon oxide film 20 to form a laminate film (second conductive film) 23D comprising those thin films. At this time, the thickness of the Al alloy film 23B may be set at 2 $\mu$m or so for example. Subsequently, as shown in FIG. 11, the laminate film 23D is etched for patterning to form a wiring line 23 in the laminate wiring forming region and a bonding pad BP in the bonding pad forming region.

Figure 12:
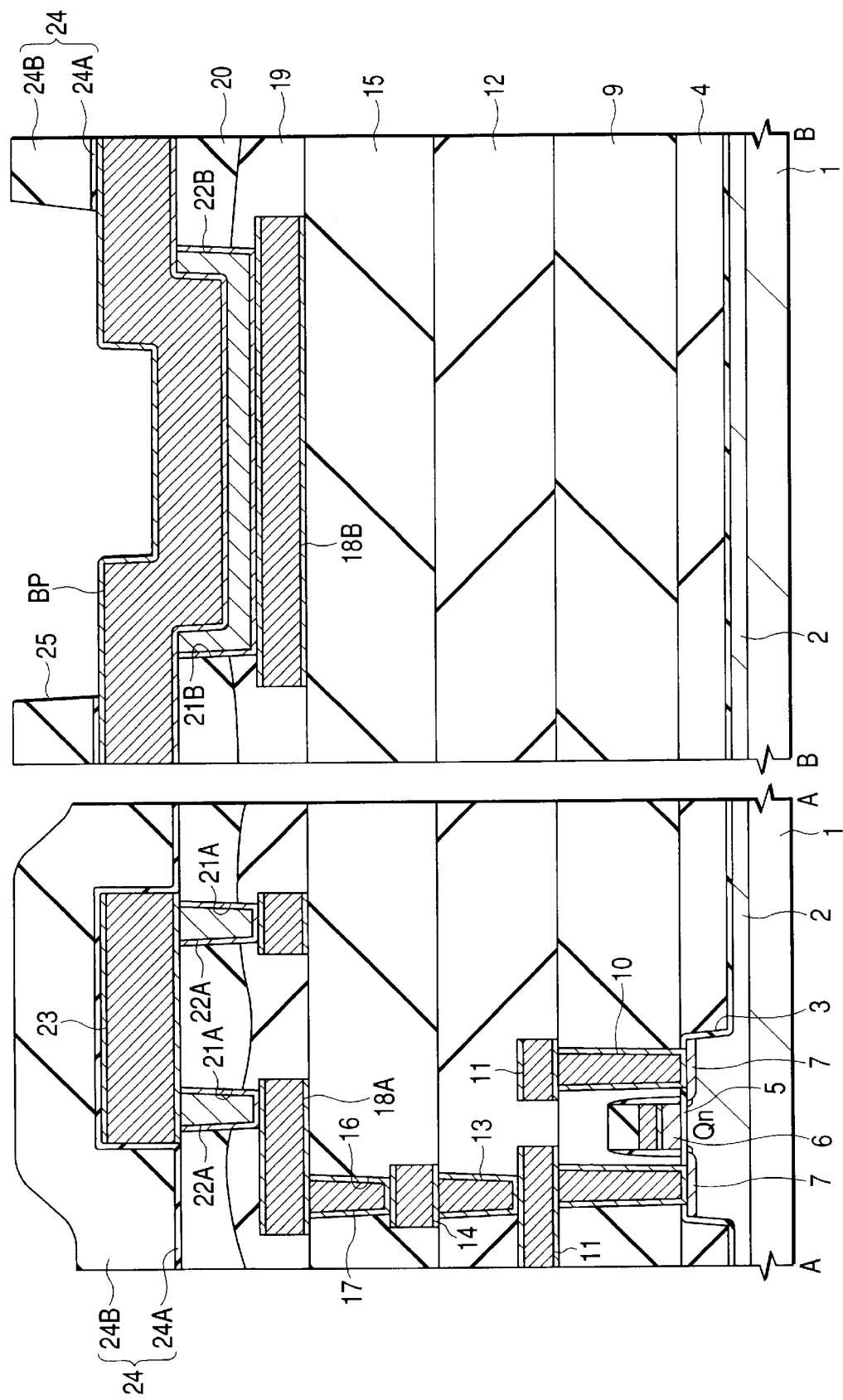
FIG. 12 is a sectional view of the principal portion in a semiconductor integrated circuit device manufacturing step which follows FIG. 11.

Next, as shown in FIG. 12, a surface protecting film 24 is formed by depositing a silicon oxide film about 200 nm in thickness and a silicon nitride film 24B about 800 nm in thickness successively onto the surface of the substrate, and thereafter the silicon nitride film 24B and silicon oxide film 24A on the bonding pad BP are removed by etching to form an aperture 25. At this time, the diameter of the aperture 25 is set relatively larger than that of the aperture 21B. Thereafter, wire 26 (see FIG. 2), for example Au wire, is bonded to the bonding pad BP to fabricate the semiconductor integrated circuit device of the first embodiment illustrated in FIG. 2.

Although in this first embodiment a description has been given above about forming the silicon oxide films 19 and 20 over the wiring lines 18A and 18B (see FIG. 5), an insulating film (SiOF for example) of a low dielectric constant which is about 4.3 or less may be formed instead of the silicon oxide films 19 and 20. Such an insulating film of a low dielectric constant is low in both mechanical strength and bondability as compared with the silicon oxide films, so it becomes easier for the bonding pad to peel off from the insulating film in question. However, as noted earlier, in this first embodiment the laminate film 22B constituted mainly by W film higher in mechanical strength than Al film is formed in the aperture 21B in the bonding pad forming region. Therefore, if an insulating film of a low dielectric constant is formed in place of the silicon oxide films 19 and 20, then by forming the laminate film 22B in the aperture 21B, it becomes possible to prevent the peeling of the bonding pad BP more effectively. Moreover, by replacing the silicon oxide films 19 and 20 with an insulating film of a low dielectric constant, a total dielectric constant of wiring in the semiconductor integrated circuit device can be decreased, so that it is possible to avoid such an inconvenience as wiring delay.

(Second Embodiment)

In a semiconductor integrated circuit device of this second embodiment wiring lines 11 and 14 (see FIGS. 1 and 2) are mainly formed of Cu (copper) unlike Al used as a main wiring component in the semiconductor integrated circuit device of the first embodiment. A method of manufacturing the semiconductor integrated circuit device of the second embodiment will be described below with reference to FIGS. 13 to 20.

The manufacturing process for the semiconductor integrated circuit device according to this second embodiment is the same up to the step of forming the plug 10 as in the previous first embodiment.

Figure 13:
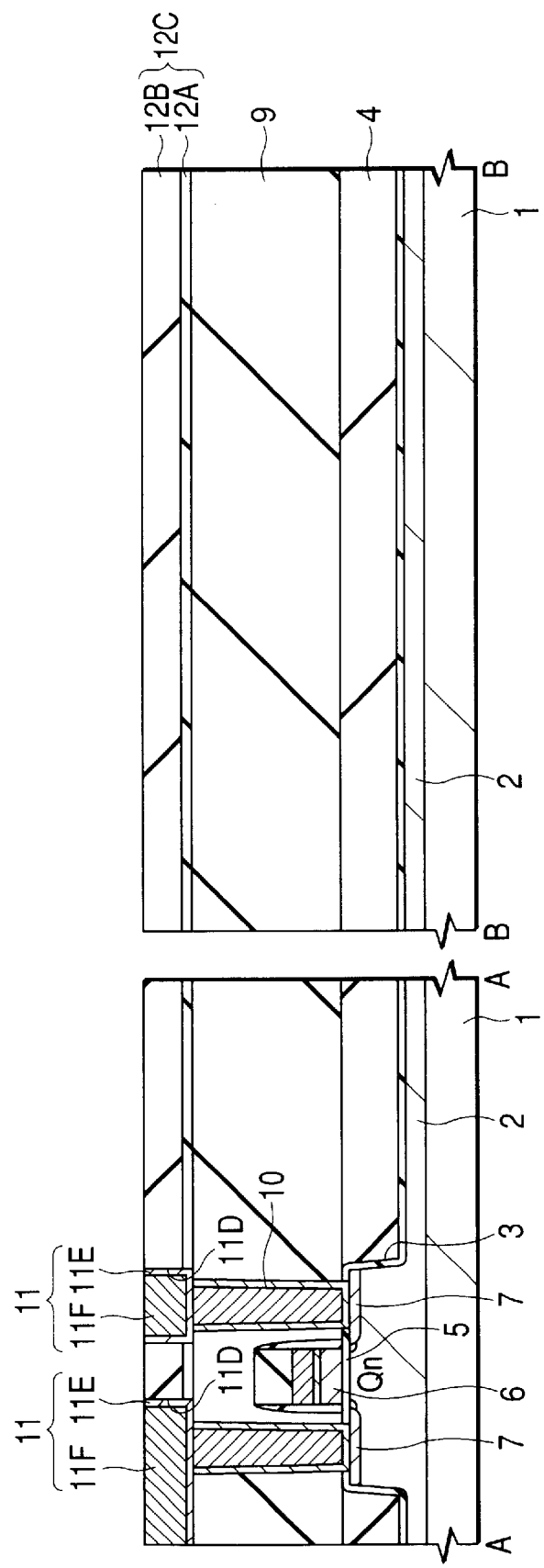
FIG. 13 is a sectional view of a principal portion, showing a method of manufacturing a semiconductor integrated circuit device according to another embodiment of the present invention.

After forming the plug 10, as shown in FIG. 13, an etching stopper film 12A, for example a silicon nitride film, and a silicon oxide film 12B are deposited in this order onto the silicon oxide film 9 to form an interlayer insulating film 12C.

Subsequently, the interlayer insulating film 12C is etched to form a wiring trench 11D whose bottom is in contact with the plug 10. Next, a barrier metal film 1E, for example a titanium nitride film, and Cu film 11 are deposited in this order over the silicon oxide film 12B including the interior of the wiring trench 11D. Thereafter, the barrier metal film 11E and Cu film on the silicon oxide film 12B are removed by the CMP method to form a wiring line 11 in the interior of the wiring trench 11D. The Cu film 11F may be substituted by a copper alloy film which contains 80 wt % or more of Cu.

Figure 14:
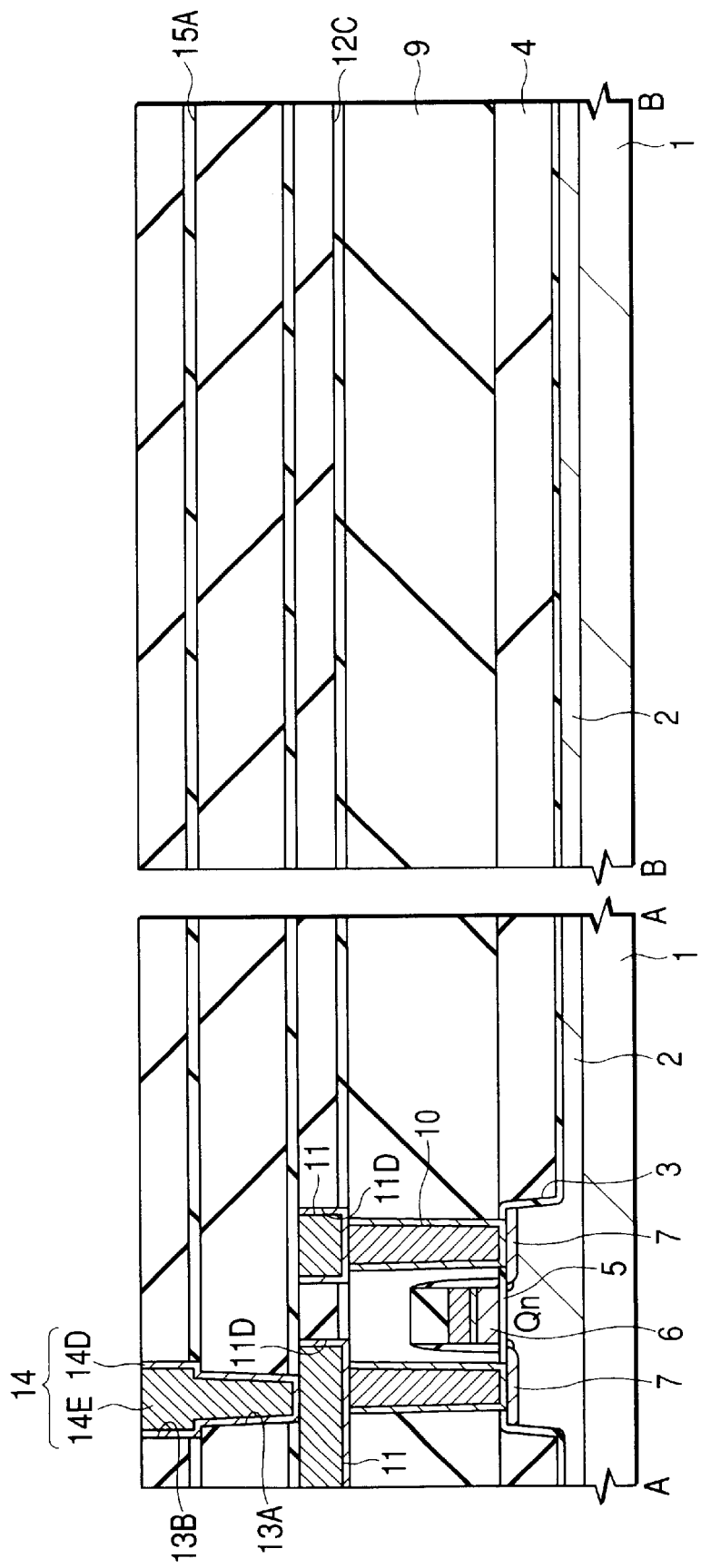
FIG. 14 is a sectional view of the principal portion in a semiconductor integrated circuit device manufacturing step which follows FIG. 13.

Next, as shown in FIG. 14, silicon nitride film, silicon oxide film, silicon nitride film, and silicon oxide film are deposited in this order over the interlayer insulating film 12C to form an interlayer insulating film (first insulating film) 15A. In forming the interlayer insulating film 15A, an insulating film (SiOF for example) with a dielectric constant of about 4.3 or less may be formed instead of silicon oxide film. With such an insulating film of a low dielectric constant, it is possible to decrease a total dielectric constant of wiring in the semiconductor integrated circuit device and hence possible to avoid such an inconvenience as wiring delay.

Subsequently, the interlayer insulating film 15A is etched to form a contact hole 13A whose bottom is in contact with the wiring line 11. Further, the silicon oxide film and silicon nitride film as upper layers in the interlayer insulating film 15A are etched to form a wiring trench 13B.

Then, a barrier metal film 14D, for example a titanium nitride film, and Cu film 14E are deposited in this order over the interlayer insulating film 15A including the interior of the wiring trench 13B and that of the contact hole 13A and thereafter the barrier metal film 14D and Cu film 14E on the interlayer insulating film 15A are removed by the CMP method to form a wiring line 14.

Figure 15:
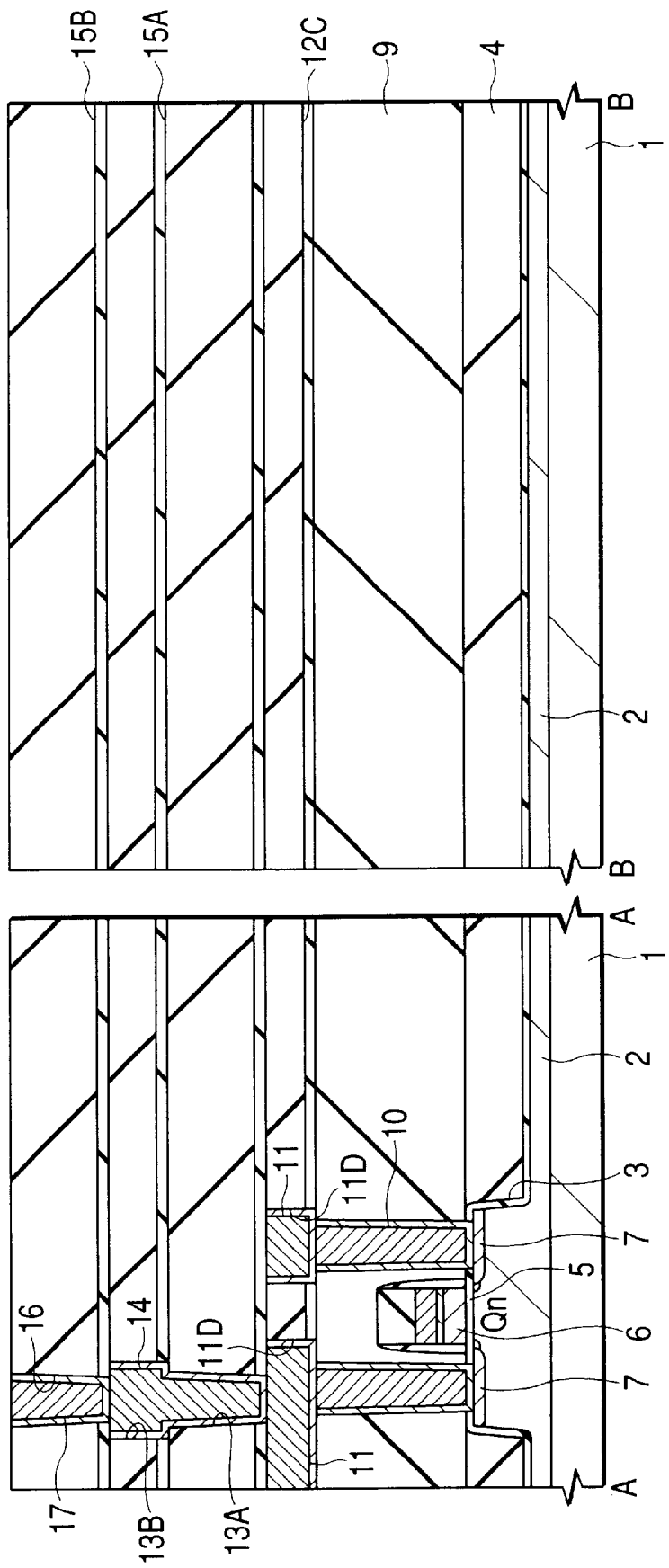
FIG. 15 is a sectional view of the principal portion in a semiconductor integrated circuit device manufacturing step which follows FIG. 14.

Next, as shown in FIG. 15, a silicon nitride film and a silicon oxide film are deposited successively over the interlayer insulating film 15A to form an interlayer insulating film (first insulating film) 15B. In forming the interlayer insulating film 15B, an insulating film (SiOF for example) with a low dielectric constant of about 4.3 or less may be formed instead of silicon oxide film. With such an insulating film of a low dielectric constant, it is possible to decrease a total dielectric constant of wiring in the semiconductor integrated circuit and hence possible to avoid such an inconvenience as wiring delay. Subsequently, the interlayer insulating film 15B is etched to form a contact hole 16 whose bottom is in contact with the wiring line 14. Then, a barrier metal film (TiN film/Ti film) and W film are deposited successively onto the interlayer insulating film 15B including the interior of the contact hole 16 and thereafter the barrier metal film and W film on the interlayer insulating film 15B are removed by the CMP method to form a plug 17. At this time, Cu film may be used as a substitute for W film.

Figure 16:
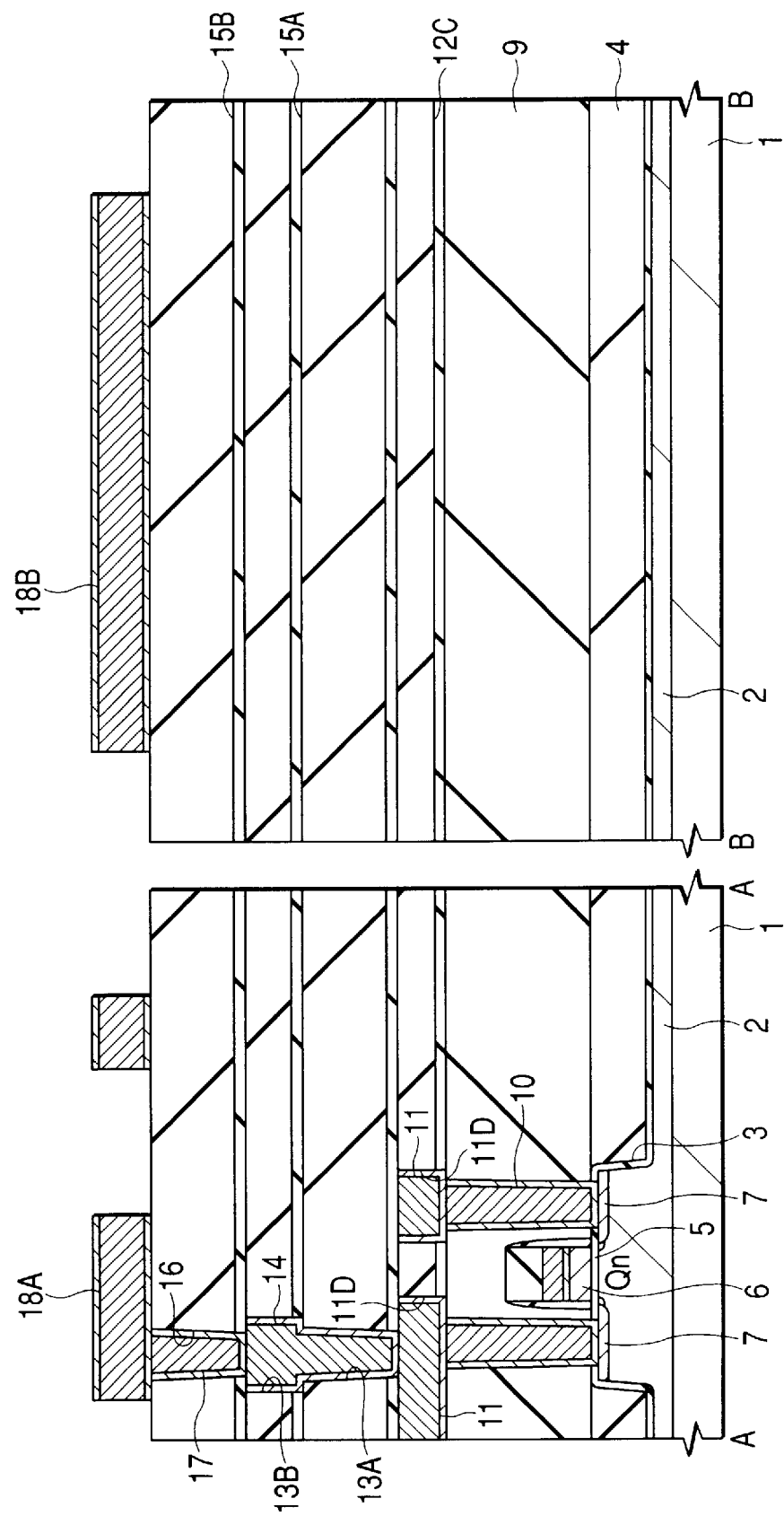
FIG. 16 is a sectional view of the principal portion in a semiconductor integrated circuit manufacturing step which follows FIG. 15.
Figure 18:
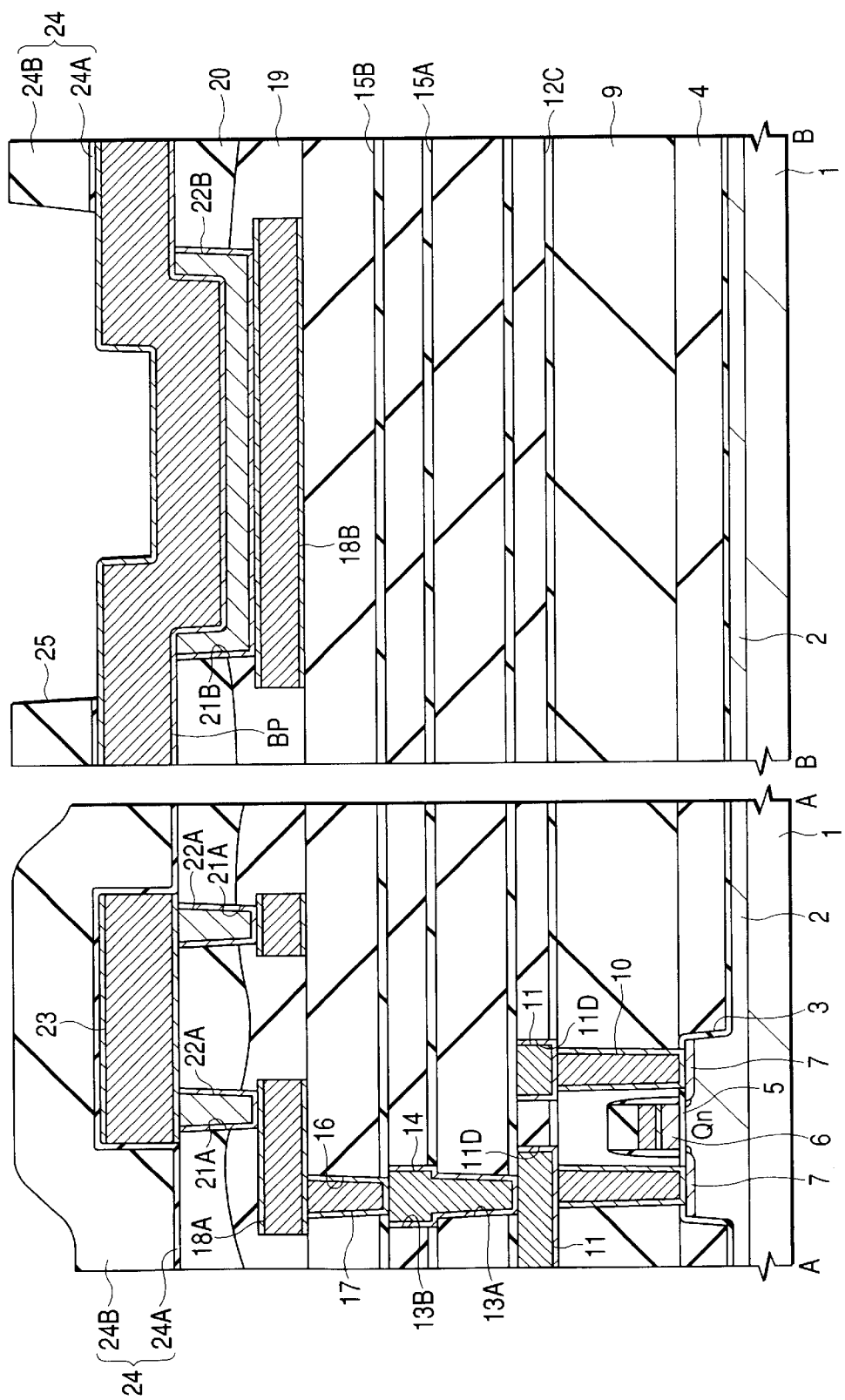
FIG. 18 is a sectional view of the principal portion in a semiconductor integrated circuit device manufacturing step which follows FIG. 17.

Then, wiring lines 18A and 18B are formed by the same step as that described with reference to FIG. 4 in the first embodiment (see FIG. 16).

Figure 5:
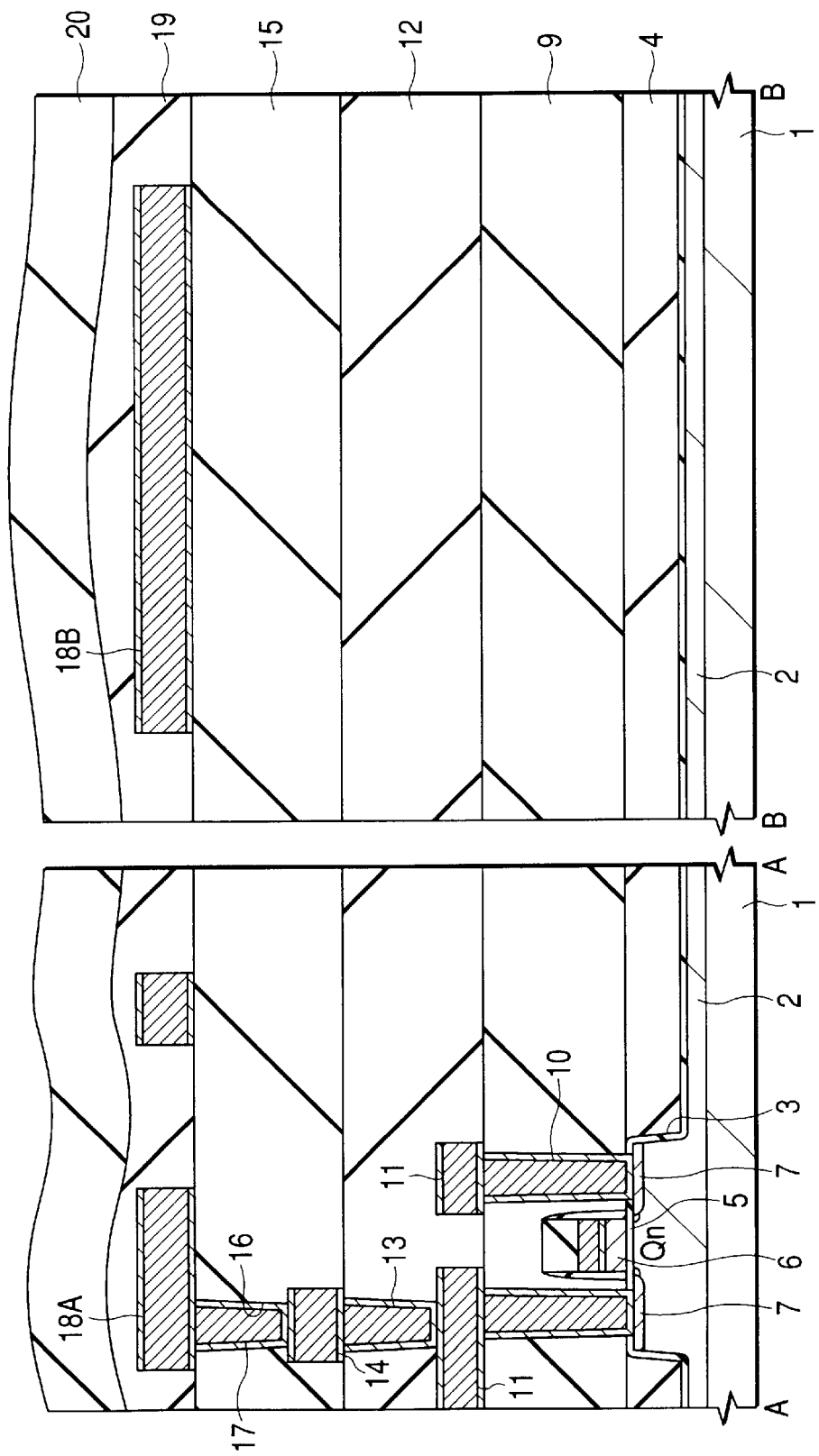
FIG. 5 is a sectional view of the principal portion in a semiconductor integrated circuit device manufacturing step which follows FIG. 4.

Subsequently, silicon oxide films 19 and 20 are formed by the same step as that described with reference to FIGS. 5 and 6 in the first embodiment. Then, contact holes 21A and an aperture 21B are formed in the silicon oxide films 19 and 20 and thereafter a barrier metal film and W film are deposited successively over the silicon oxide film 20 including the interiors of the contact holes 21A and the interior of the aperture 21B. Thereafter, the W film and barrier metal film located outside the contact holes 22A and aperture 22B are removed by the CMP method to form plugs 22A within the contact holes 21A and form a laminate film 22B within the aperture 21B. Subsequently, a wiring line 23 and a bonding pad BP are formed by the same step as that described with reference to FIGS. 10 and 11 in the first embodiment (see FIG. 17).

Figure 19:
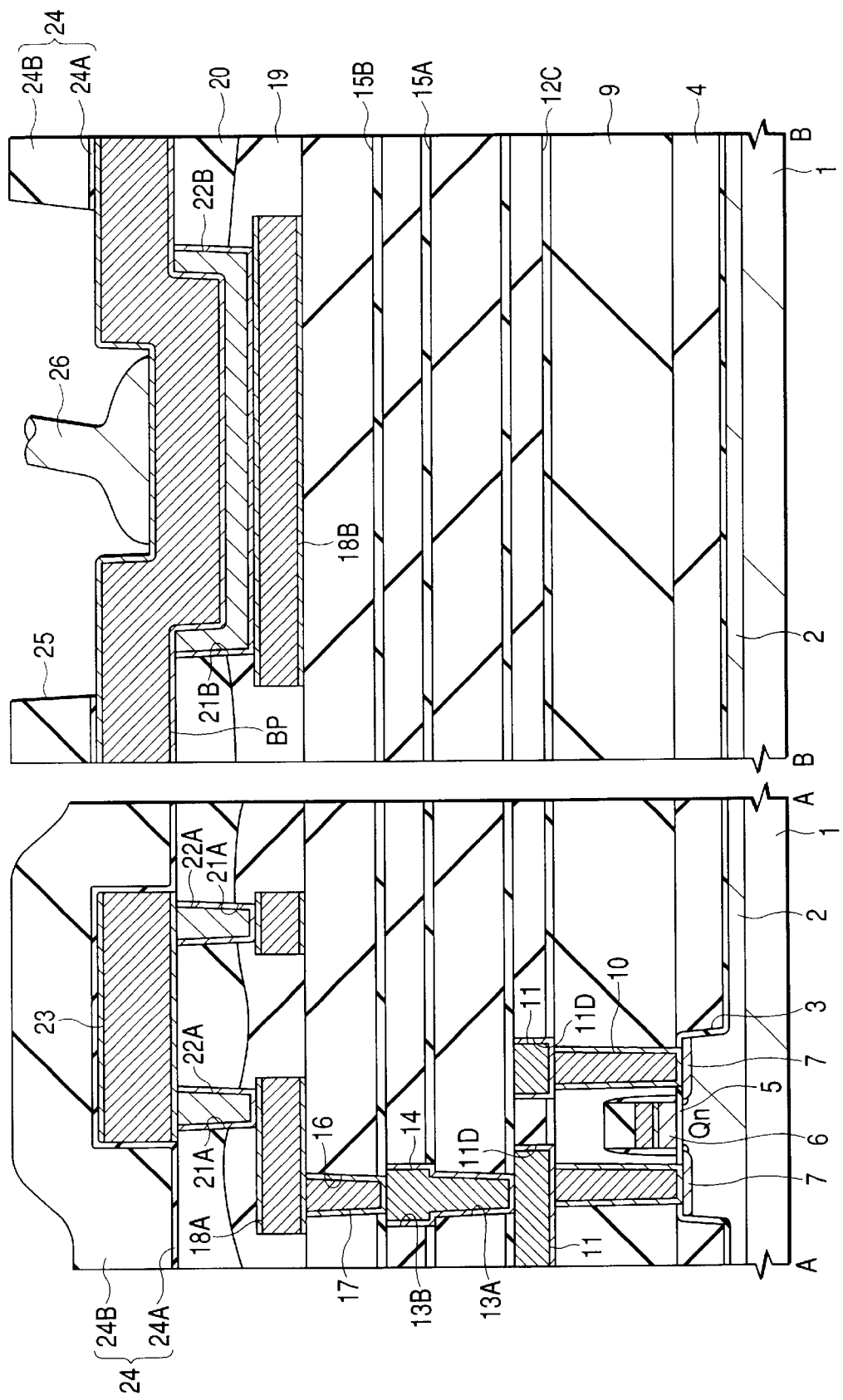
FIG. 19 is a sectional view of the principal portion in a semiconductor integrated circuit manufacturing step which follows FIG. 18.

Next, a silicon oxide film 24A and a silicon nitride film 24B are deposited in this order onto the substrate 1 by the same step as that described with reference to FIG. 12 in the first embodiment to form a surface protecting film 24. Thereafter, the silicon nitride film 24B and the silicon oxide film 24A on the bonding pad BP are removed by etching to form an aperture 25 (see FIG. 18). Subsequently, as shown in FIG. 19, wire 26, for example Au wire, is bonded to the bonding pad BP in the aperture 25 to fabricate the semiconductor integrated circuit device of the second embodiment.

Thus, according to this second embodiment, the laminate film 22B constituted mainly by W film which is higher in physical strength and larger in thickness than the Ti film and TiN film included in the wiring line 18B and bonding pad BP, is formed within the aperture 21B underlying the bonding pad and it is interposed between the wiring line 18B and the bonding pad BP. Thus, even where the wiring lines 11 and 14 are formed using Cu film as a main conductive layer, it is possible to prevent cracking of the Ti film and TiN film in wire bonding. That is, it becomes possible to prevent peeling of the bonding pad BP from the laminate film 22B.

Figure 20:
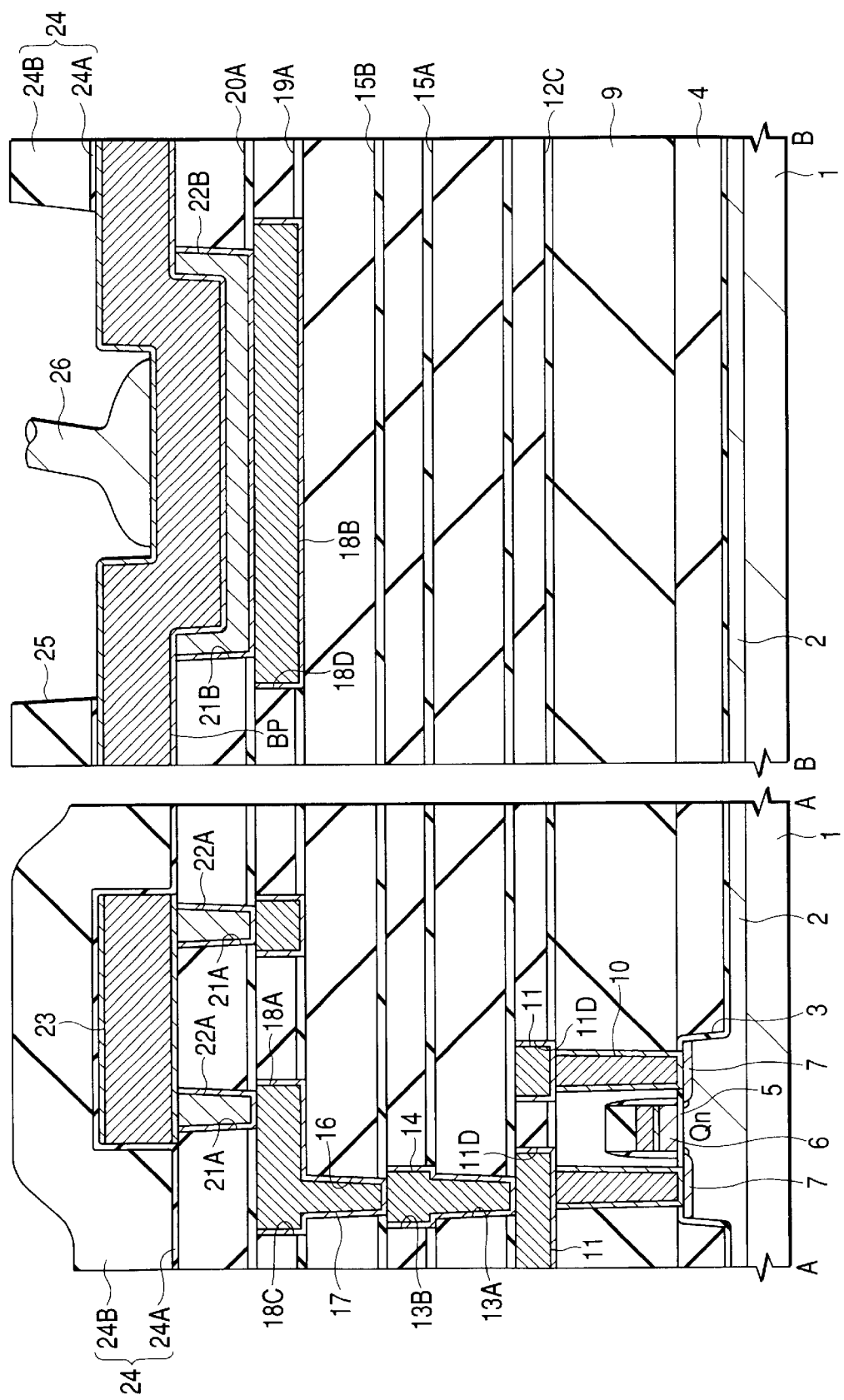
FIG. 20 is a sectional view of a principal portion of a semiconductor integrated circuit device according to a further embodiment of the present invention.

Although in this second embodiment the wiring lines 18A and 18B are formed using Al film as a main conductive layer, Cu film may be used as a main conductive layer (see FIG. 20). In this case, the silicon oxide films 19 and 20 (see FIG. 17) are replaced with laminate films 19A and 20A formed by laminating silicon nitride film and silicon oxide film from below. The wiring lines 18A and 18B can be formed respectively within wiring trenches 18C and 18D formed by etching the laminate film 19A in accordance with the same step as the foregoing step of forming the wiring lines 14. As to the plugs 17, they can be formed together at the time of forming the wiring lines 18A.

Although the present invention has been described above concretely by way of embodiments thereof, it goes without saying that the present invention is not limited to those embodiments, but that various changes may be made within the scope not departing from the gist of the invention.

For example, although in the above embodiments MISFET and laminate wiring are not formed below the bonding pad, they may underlie the bonding pad.

Although in the above second embodiment a silicon nitride film is formed as an etching stopper film in forming contact holes and wiring trenches, there may be formed a silicon carbide film or a silicon carbonitride film.

The following is a brief description of effects obtained by typical inventions disclosed herein.

A laminate film (second conductor piece) constituted mainly by W film is formed in an aperture (first aperture) of an insulating film (second insulating film) in which a bonding pad (third conductor piece) constituted mainly by Al alloy film is disposed, and the laminate film is interposed between the bonding pad and a wiring line (first conductor piece) located just under the bonding pad, whereby it is possible to prevent cracking of Ti film and TiN film included in all of the bonding pad, the laminate film and the wiring line which cracking is caused by vibration and loading during wire bonding, and hence it is possible to effectively prevent the peeling of the bonding pad from the laminate film.

What is claimed is:

1. A method of manufacturing a semiconductor integrated circuit device, including the steps of:
   (a) forming a first insulating film on a semiconductor substrate;
   (b) forming a first conductor piece on said first insulating film;
   (c) forming a second insulating film on said first insulating film and said first conductor piece and thereafter forming a first aperture in said second insulating film, said first aperture extending down to an upper surface of said first conductor piece;
   (d) forming a first conductive film on said second insulating film including the interior of said first aperture, said first conductive film having a thickness smaller than the depth of said first aperture at a central plane portion of said first aperture, and said first conductive film including a tungsten layer;
   (e) polishing said first conductive film on said second insulating film chemically and mechanically, allowing the first conductive film to remain within said first aperture, thereby forming a second conductor piece within the first aperture, said second conductor piece being constituted by said first conductive film;
   (f) forming a third conductor piece, which is in contact with said second conductor piece, on said second conductor piece; and
   (g) connecting an external terminal to said third conductor piece.

2. The method according to claim 1, wherein said step (f) includes the steps of:
   (f1) forming an aluminum film on said second insulating film and said second conductor piece; and
   (f2) patterning said aluminum film into a predetermined shape to form said third conductor piece constituted by said aluminum film.

3. The method according to claim 1, further including the steps of:
   (h) depositing a third insulating film on said second insulating film and said third conductor piece; and
   (i) forming a second aperture in said third insulating film in a region where said third conductor piece and said external terminal are connected together.

4. A method of manufacturing a semiconductor integrated circuit device, comprising the steps of:
   (a) forming a first insulating film on a semiconductor substrate;
   (b) forming a first conductor piece on said first insulating film;
   (c) forming a second insulating film on said first insulating film and said first conductor piece and thereafter forming a first aperture in said second insulating film, said first aperture extending down to an upper surface of said first conductor piece;
   (d) forming a first conductive film on said second insulating film including the interior of said first aperture, said first conductive film having a thickness smaller than the depth of said first aperture at a central plane portion of said first aperture, and said first conductive film including a tungsten layer;
   (e) polishing said first conductive film on said second insulating film chemically and mechanically, allowing the first conductive film to remain within said first aperture, thereby forming a second conductor piece within the first aperture, said second conductor piece being constituted by said first conductive film;
   (f) forming a third conductor piece, which is in contact with said second conductor piece, on said second conductor piece; and
   (g) connecting wire to said third conductor piece.

5. The method according to claim 4, wherein said step (f) includes the steps of:
   (f1) forming an aluminum film on said second insulating film and said second conductor piece; and
   (f2) patterning said aluminum film into a predetermined shape to form said third conductor piece constituted by said aluminum film.

6. The method according to claim 4, further including the steps of:
   (h) depositing a third insulating film on said second insulating film and said third conductor piece; and
   (i) forming a second aperture in said third insulating film in a region where said third conductor piece and said wire are connected together.

7. A method of manufacturing a semiconductor integrated circuit device, including the steps of:
   (a) forming a first insulating film on a semiconductor substrate;
   (b) forming a first conductor piece on said first insulating film;
   (c) forming a second insulating film on said first insulating film and said first conductor piece and thereafter forming a first aperture in said second insulating film, said first aperture extending down to an upper surface of said first conductor piece;
   (d) forming a first conductive film on said second insulating film including the interior of said first aperture, said first conductive film having a thickness smaller than the depth of said first aperture at a central plane portion of said first aperture;

(e) polishing said first conductive film on said second insulating film chemically and mechanically, allowing the
first conductive film to remain within said first aperture, thereby forming a second conductor piece within the first aperture, said second conductor piece being constituted by said first conductive film;

(f) forming a third conductor piece, which is in contact with said second conductor piece, on said second conductor piece, including:
   (f1) forming an aluminum film on said second insulating film and said second conductor piece; and
   (f2) patterning said aluminum film into a predetermined shape to form said third conductor piece constituted by said aluminum film; and (g) connecting an external terminal to said third conductor piece.

8. The method according to claim 7, further including the steps of:
   (h) depositing a third insulating film on said second insulating film and said third conductor piece; and
   (i) forming a second aperture in said third insulating film in a region where said third conductor piece and said external terminal are connected together.

9. A method of manufacturing a semiconductor integrated circuit device, including the steps of:
   (a) forming a first insulating film on a semiconductor substrate;
   (b) forming a first conductor piece on said first insulating film;
   (c) forming a second insulating film on said first insulating film and said first conductor piece and thereafter forming a first aperture in said second insulating film, said first aperture extending down to an upper surface of said first conductor piece;
   (d) forming a first conductive film on said second insulating film including the interior of said first aperture, said first conductive film having a thickness smaller than the depth of said first aperture at a central plane portion of said first aperture;
   (e) polishing said first conductive film on said second insulating film chemically and mechanically, allowing the first conductive film to remain within said first aperture, thereby forming a second conductor piece within the first aperture, said second conductor piece being constituted by said first conductive film;
   (f) forming a third conductor piece, which is in contact with said second conductor piece, on said second conductor piece;
   (g) connecting an external terminal to said third conductor piece;
   (h) depositing a third insulating film on said second insulating film and said third conductor piece; and
   (i) forming a second aperture in said third insulating film in a region where said third conductor piece and said external terminal are connected together.

10. A method of manufacturing a semiconductor integrated circuit device, including the steps of:
   (a) forming a first insulating film on a main surface of a semiconductor substrate;
   (b) forming a first conductor piece on said first insulating film in a first region of the main surface of said semiconductor substrate and forming a fourth conductor piece on said first insulating film in a second region of the main surface of said semiconductor substrate;
   (c) forming a second insulating film on said first insulating film and said first and fourth conductor pieces;
   (d) etching said second insulating film on said first conductor piece to form a first aperture having a first diameter and extending down to said first conductor piece, and etching said second insulating film on said fourth conductor piece to form a third aperture having a second diameter and extending down to said fourth conductor piece;
   (e) forming a first conductive film on said second insulating film including the interior of said first aperture and that of said third aperture, said first conductive film having a thickness smaller than half of said first diameter and not smaller than half of said second diameter;
   (f) polishing said first conductive film on said second insulating film chemically and mechanically, allowing said first conductive film to remain within said first and third apertures, thereby forming a second conductor piece and a fifth conductor piece within said first and third apertures, respectively, said second and fifth conductor pieces being each constituted by said first conductor film;
   (g) forming a second conductive film on said second and fifth conductor pieces and said second insulating film;
   (h) forming third and sixth conductor pieces in said first and second regions, respectively, said third and sixth conductor pieces being in contact with said second and fifth conductor pieces, respectively;
   (i) forming a third insulating film on said third and sixth conductor pieces and said second insulating film;
   (j) etching said third insulating film on said third conductor piece to form a second aperture in said third insulating film, said second aperture extending down to said third conductor piece; and
   (k) connecting an external terminal to said third conductor piece after said step (j).

11. The method according to claim 10, wherein said first insulating film includes an insulating film having a dielectric constant of 4 or less.

12. The method according to claim 10, wherein said second conductive film includes an aluminum layer.

13. A method of manufacturing a semiconductor integrated circuit device, including the steps of:
   (a) forming a first insulating film on a main surface of a semiconductor substrate;
   (b) forming a first conductor piece on said first insulating film in a first region of the main surface of said semiconductor substrate and forming a fourth conductor piece on said first insulating film in a second region of the main surface of said semiconductor substrate;
   (c) forming a second insulating film on said first insulating film and said first and fourth conductor pieces; (d) etching said second insulating film on said first conductor piece to form a first aperture having a first diameter and extending down to said first conductor piece, and etching said second insulating film on said fourth conductor piece to form a third aperture having a second diameter and extending down to said fourth conductor piece;
   (e) forming a first conductive film on said second insulating film including the interior of said first aperture and that of said third aperture, said first conductive film having a thickness smaller than half of said first diameter and not smaller than half of said second diameter;
   (f) polishing said first conductive film on said second insulating film chemically and mechanically, allowing said first conductive film to remain within said first and third apertures, thereby forming a second conductor piece and a fifth conductor piece within said first and third apertures, respectively, said second and fifth conductor pieces being each constituted by said first conductor film;

(g) forming a second conductive film on said second and fifth conductor pieces and said second insulating film;

(h) forming third and sixth conductor pieces in said first and second regions, respectively, said third and sixth conductor pieces being in contact with said second and fifth conductor pieces, respectively;

(i) forming a third insulating film on said third and sixth conductor pieces and said second insulating film;

(j) etching said third insulating film on said third conductor piece to form a second aperture in said third insulating film, said second aperture extending down to said third conductor piece; and (k) connecting wire to said third conductor piece after said step (j).

14. The method according to claim 13, wherein said first conductive film includes a tungsten layer.

15. The method according to claim 14, wherein said second conductive film includes an aluminum layer.

16. The method according to claim 13, wherein said first insulating film includes an insulating film having a dielectric constant of 4 or less.

* * * * *